US012000878B1

(12) United States Patent
Chini et al.

(10) Patent No.: US 12,000,878 B1
(45) Date of Patent: Jun. 4, 2024

(54) SYSTEMS AND METHODS FOR CHARACTERIZING LASER PULSES

(71) Applicant: University of Central Florida Research Foundation, Inc., Orlando, FL (US)

(72) Inventors: Michael Chini, Orlando, FL (US); Yangyang Liu, Orlando, FL (US); Shima Gholam-Mirzaei, Orlando, FL (US); John Beetar, Orlando, FL (US); Jonathan Nesper, Orlando, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 185 days.

(21) Appl. No.: 17/688,637

(22) Filed: Mar. 7, 2022

Related U.S. Application Data

(60) Provisional application No. 63/184,652, filed on May 5, 2021.

(51) Int. Cl.
*G01R 29/12* (2006.01)
*G01J 3/443* (2006.01)
*G02B 27/10* (2006.01)
*G02F 1/355* (2006.01)

(52) U.S. Cl.
CPC ............. *G01R 29/12* (2013.01); *G01J 3/443* (2013.01); *G02B 27/108* (2013.01); *G02F 1/3551* (2013.01)

(58) Field of Classification Search
CPC ....... G01R 29/12; G01J 3/443; G02B 27/108; G02F 1/3551
See application file for complete search history.

(56) References Cited

U.S. PATENT DOCUMENTS

2006/0088259 A1* 4/2006 Weiner ............... G01J 11/00
359/328

OTHER PUBLICATIONS

Cho, W. et al., "Temporal characterization of femtosecond laser pulses using tunneling ionization in the IV, visible, and mid-IR ranges", Sci Rep 9, 16067 (2019).
Kane, Daniel J., "Single-shot measurement of the intensity and phase of an arbitrary ultrashort pulse by using frequency-resolved optical gating," Opt. Letter. 18, 823-825 (1993).
Park, Seung Beom et al., "Direct sampling of a light wave air," Optica 5, 402-408 (2018).

(Continued)

*Primary Examiner* — Jay Patidar
(74) *Attorney, Agent, or Firm* — Suiter Swantz IP

(57) ABSTRACT

A laser diagnostic device may include a beamsplitter to split one or more input pulses into one or more fundamental pulses and one or more perturbing pulses, one or more beam-combining optics to combine the fundamental and perturbing pulses at a detection plane, a detector including a solid-state material at the detection plane, and a controller. The controller may receive a detector signal from the detector is indicative of nonlinear absorption in the solid-state medium of the fundamental pulses that is perturbed by the perturbing pulses. The controller may further extract a temporal electric field waveform of the one or more input pulses from the detector signal and provide as an output at least one of the temporal electric field waveform, a spectrum, or a spectral phase of the one or more input pulses.

24 Claims, 21 Drawing Sheets

(56) References Cited

OTHER PUBLICATIONS

Saito, Nariyuki et al., "All-optical characterization of the two-dimensional waveform and the Gouy phase of an infrared pulse based on plasma fluorescence of gas," Opt., Express 26, 24591-24601 (2018).
Wu, Q. et al., "Free-space electro-optic sampling of terahertz beams", Appl. Phys. Lett. 67, 3523 (1995).
Y. Liu, et al., "All-optical sampling of few-cycle infrared pulses using tunneling in a solid," Photon. Res. 9, 929-936 (2021).
Y. Liu, et al., "All-optical sampling of few-cycle infrared waveforms using tunneling in a solid," in Conference on Lasers and Electro-Optics, J. Kang, S. Tomasulo, I. Ilev, D. Müller, N. Litchinitser, S. Polyakov, V. Podolskiy, J. Nunn, C. Dorrer, T. Fortier, Q. Gan, and C. Saraceno, eds., OSA Technical Digest (Optica Publishing Group, 2021), paper SW3J.5.https://opg.optica.org/abstract.cfm?URI=CLEO_SI-2021-SW3J.5.
Y. Liu, et al., "Single-shot Measurement of Infrared Laser Waveforms using Multiphoton Photoconductivity in an Image Sensor," in Conference on Lasers and Electro-Optics, J. Kang, S. Tomasulo, I. Ilev, D. Müller, N. Litchinitser, S. Polyakov, V. Podolskiy, J. Nunn, C. Dorrer, T. Fortier, Q. Gan, and C. Saraceno, eds., OSA Technical Digest (Optica Publishing Group, 2021), paper SW3J.6.
Y. Liu, et al., "All-optical sampling of few-cycle infrared pulses using tunneling in a solid," Phot. Res. 9 (6), 929-936 (2021).
Y. Liu, et al., "Single-shot measurements of few-cycle optical waveforms on a chip," Nat. Photonics 16, 109-112 (2022).

\* cited by examiner

SYSTEMS AND METHODS FOR CHARACTERIZING LASER PULSES

CROSS-REFERENCE TO RELATED APPLICATION

The present application claims the benefit under 35 U.S.C. § 119(e) of U.S. Provisional Application Ser. No. 63/184,652, filed on May 5, 2021, entitled ULTRASHORT PULSE FIELD MEASUREMENT DEVICE, naming Michael Chini, Yanyang Liu, Shima Gholam-Mirzaei, John Beetar, and Jonathan Nesper as inventors, which is incorporated herein by reference in the entirety.

GOVERNMENT LICENSE RIGHTS

This invention was made with Government support under Grant No. FA95501610149 awarded by the Air Force Office of Scientific Research (AFOSR); Grant No. DESC0019291 awarded by the Department of Energy; and Grant Nos. 1809181 and 1806135 awarded by the National Science Foundation (NSF). The Government has certain rights in this invention.

TECHNICAL FIELD

The present disclosure relates generally to techniques for characterizing ultrashort pulses and, more particularly, to single-shot electric field measurements of ultrashort pulses.

BACKGROUND

Ultrashort laser pulses (e.g., pulses with timescales on the order of picoseconds or shorter) are used in a wide range of industrial and research applications for their ability to probe ultrafast dynamic processes and induce nonlinear effects in many materials. It is thus desirable to develop sources for generating ultrashort laser pulses at a wide range of wavelengths, including various infrared (IR) spectral bands, as well as techniques for characterizing ultrashort laser pulses at these wavelengths. Further, it is often desirable to characterize not only the intensity envelopes of such pulses, but also the temporal electric field waveforms, particularly for pulses with only a few electric field cycles (e.g., few-cycle pulses).

However, existing techniques for characterizing ultrashort laser pulses typically either fail to resolve the electric field waveforms of the pulses or rely on measurement geometries that require averaging over many laser shots.

SUMMARY

A laser diagnostic device is disclosed in accordance with one or more illustrative embodiments. In one illustrative embodiment, the laser diagnostic device includes a beam-splitter to receive one or more input pulses and split the one or more input pulses into one or more fundamental pulses and one or more perturbation pulses, the one or more fundamental pulses having a higher power than the perturbation pulses. In another illustrative embodiment, the laser diagnostic device includes one or more beam-combining optics to combine the one or more fundamental pulses and the one or more perturbation pulses at a detection plane. In another illustrative embodiment, the laser diagnostic device incudes a detector including a solid-state material located at the detection plane. In another illustrative embodiment, the laser diagnostic device includes a controller. In another illustrative embodiment, the controller receives a detector signal from the detector, where the detector signal is indicative of non-linear absorption in the solid-state medium of the one or more fundamental pulses that is perturbed by the one or more perturbation pulses. In another illustrative embodiment, the controller extracts a temporal electric field profile of the one or more input pulses from the detector signal. In another illustrative embodiment, the controller provides as an output measurement at least one of the temporal electric field profile of the one or more input pulses, a spectrum of the input pulse derived from the temporal electric field profile, or a spectral phase of the input pulse derived from the temporal electric field profile.

A laser diagnostic method is disclosed in accordance with one or more illustrative embodiments. In one illustrative embodiment, the method includes splitting one or more input pulses into one or more fundamental pulses and one or more perturbation pulses, the one or more fundamental pulses having a higher power than the perturbation pulses. In another illustrative embodiment, the method includes combining the one or more fundamental pulses and the one or more perturbation pulses at solid-state material at a detection plane. In another illustrative embodiment, the method includes generating a detection signal from a detector indicative of non-linear absorption in the solid-state medium of the one or more fundamental pulses that is perturbed by the one or more perturbation pulses. In another illustrative embodiment, the method includes extracting a temporal electric field profile of the one or more input pulses from the detector signal. In another illustrative embodiment, the method includes providing as an output measurement at least one of the temporal electric field profile of the one or more input pulses, a spectrum of the input pulse derived from the temporal electric field profile, or a spectral phase of the input pulse derived from the temporal electric field profile.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1:
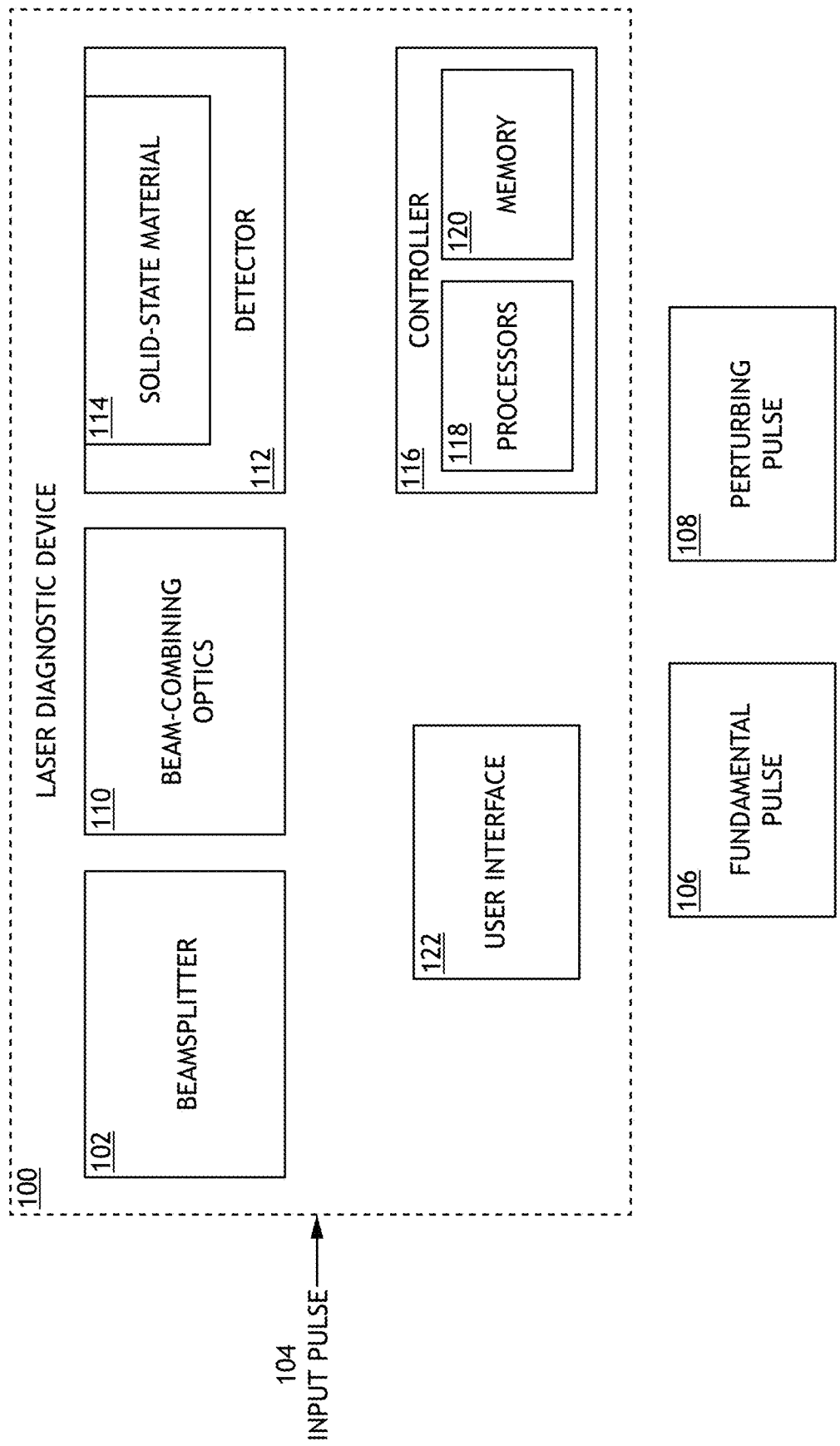
FIG. 1 is a conceptual block diagram illustrating a laser diagnostic device for characterizing the electric field waveforms of ultrashort laser pulses, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for characterizing the electric field waveforms of laser pulses such as, but not limited to, ultrashort pulses. For the purposes of the present disclosure, the term ultrashort pulse generally refers to pulses on the order of picoseconds (ps) or shorter (e.g., 1000 ps). In some embodiments, the systems and methods of the present disclosure provide characterization of few-cycle or single-cycle pulses (e.g., pulses typically on the order of 10 femtoseconds (fs) or less that include a limited number of electric field cycles within an electric field envelope). However, it is to be understood that references herein to the measurement of ultrashort pulses are solely provided for illustrative purposes and are not limited. Rather, the systems and methods disclosed herein may be used to characterize pulses of any pulse duration.

Following the development of chirped pulse amplification and Kerr lens mode-locking for the production of high-energy, femtosecond laser pulses, techniques for characterizing the time-dependent intensity envelopes of such pulses were developed. Notably, the Frequency-Resolved Optical Gating (FROG) technique has been widely adopted since its discovery in the early 1990s, due to its simple experimental setup, broad applicability for different wavelengths and pulse durations, and suitability for single-shot measurements. The FROG technique is generally described in Daniel J. Kane and Rick Trebino, "Single-shot measurement of the intensity and phase of an arbitrary ultrashort pulse by using frequency-resolved optical gating," Opt. Lett. 18, 823-825 (1993), which is incorporated by reference herein in its entirety. FROG has two primary drawbacks: namely that it requires a complex algorithm to retrieve the pulse duration, and that it is sensitive only to the intensity envelope (and not the electric field) of the pulse.

To characterize the electric field of a light pulse (including the carrier-envelope phase or absolute phase), the electro-optic sampling technique was demonstrated a few years later; however, its applicability has largely been limited to the terahertz spectral range. The electro-optic sampling technique is generally described in Q. Wu and X.-C. Zhang, "Free-space electro-optic sampling of terahertz beams," Appl. Phys. Lett. 67, 3523 (1995), which is incorporated herein by reference in its entirety. More recently, a number of techniques have been proposed to characterize the electric field, including the carrier wave oscillations, of light pulses in the near-infrared. One such technique is the TIPTOE technique (tunneling ionization with a perturbation for time-domain observation of an electric field), which relies upon the detection of perturbations arising from field-induced tunneling in a gas. Following the initial demonstration of the technique in 2018 by detecting electrical currents generated by field ionization of the gas, it was adapted to an all-optical detection scheme and demonstrated to be applicable at a wide array of wavelengths ranging from the UV to the mid-IR. The TIPTOE technique is generally described in the following publications, all of which are incorporated by reference herein in their entirety: Seung Beom Park, Kyungseung Kim, Wosik Cho, Sung In Hwang, Igor Ivanov, Chang Hee Nam, and Kyung Taec Kim, "Direct sampling of a light wave in air," Optica 5, 402-408 (2018); Nariyuki Saito, Nobuhisa Ishii, Teruto Kanai, and Jiro Itatani, "All-optical characterization of the two dimensional waveform and the Gouy phase of an infrared pulse based on plasma fluorescence of gas," Opt. Express 26, 24591-24601 (2018); and Cho, W., Hwang, S. I., Nam, C. H. et al. Temporal characterization of femtosecond laser pulses using tunneling ionization in the UV, visible, and mid-IR ranges. Sci Rep 9, 16067 (2019). The TIPTOE technique still has several limitations, mainly the need for high laser intensities to field ionize a gas, and the requirement of a scanning geometry which requires averaging over many shots.

Referring now to FIGS. 1-11, systems and methods for systems and methods for characterizing the electric field waveforms of ultrashort laser pulses, in accordance with one or more embodiments of the present disclosure.

FIG. 1 is a conceptual block diagram illustrating a laser diagnostic device 100 for characterizing the electric field waveforms of ultrashort laser pulses, in accordance with one or more embodiments of the present disclosure. In this way, the laser diagnostic device 100 may operate as an optical oscilloscope.

In some embodiments, a laser diagnostic device 100 includes a beamsplitter 102 to split an input pulse 104 (e.g., an input ultrashort pulse) into a relatively strong fundamental pulse 106 and a relatively weak perturbing pulse 108, beam-combining optics 110 to combine the fundamental pulse 106 with the perturbing pulse 108 at a detection plane, and a detector 112 based on a solid-state material 114 at the detection plane having a bandgap higher than a photon energy of the input pulse 104.

In this configuration, the fundamental pulse 106 may induce nonlinear absorption processes such as tunneling or multiphoton absorption, which may induce a detector signal in the detector 112. Under conditions where the perturbing pulse 108 is sufficiently weak, the perturbing pulse 108 may not induce nonlinear absorption alone. Instead, the presence of the perturbing pulse 108 is observed as a weak modulation on the detector signal produced by the fundamental pulse 106. Importantly, this modulation does not arise due to linear interference between the fundamental and perturbation pulses, but rather as a cross-correlation between the perturbation pulse and a sub-cycle electro-optic gate in the detector. It is contemplated herein that measurements of such perturbations in the detector signal over a range of temporal delays between the fundamental pulse 106 and the perturbing pulse 108 may provide a measurement of the temporal electric field waveform of the input pulse 104. For example, from the perturbed detector signal, the modulation waveform of the perturbing pulse 108 may be obtained by subtracting the signal associated solely with the fundamental pulse 106, followed by a normalization process to remove the effects of the spatial variation of the beam profile of the fundamental pulse 106. Further, the Fourier transform of the modulation waveform may provide the frequency spectrum, which can be compared to an independent measurement of the spectrum, and the spectral phase.

Perturbations of nonlinear absorption in the solid-state material 114 can be detected using various techniques within the spirit and scope of the present disclosure such as, but not limited to, an optical signature of band fluorescence or by an electrical signature associated with an increase in photoconductivity (e.g., of a solid-state material 114 including image sensor). The use of a solid-state material 114 has several advantages over the TIPTOE and other similar techniques. For example, it allows the use of intensities that are approximately two orders of magnitude lower than is required for ionization of air, and allows the use of integrated circuits and/or imaging sensors to obtain two-dimensional data. The combination of these two advantages makes it possible to characterize the input pulse 104 in a single shot by mapping the time axis to a spatial axis.

The systems and methods disclosed herein may be implemented in both a scanning-based configuration in which a detector signal is based on many input pulses 104 or in a single-shot configuration in which the detector signal is based on a single input pulse 104. Additionally, the systems and methods disclosed herein may provide measurements of pulses having frequencies ranging from the ultraviolet (UV) to the far-IR based on the selection of the detector.

In some embodiments, the laser diagnostic device 100 disclosed herein utilizing measurements of perturbations of nonlinear absorption may be used to measure a full electric field waveform of an input pulse 104 including the carrier envelope phase (CEP) of the input pulse 104. For example, the CEP may be measured by setting the CEP of the fundamental pulse 106 to zero such that measured perturbations of the detector signal corresponds to the electric field of the perturbing pulse 108.

In some embodiments, the laser diagnostic device 100 includes a controller 116 with one or more processors 118 configured to execute program instructions maintained on memory 120, or a memory device. controller 116 may be communicatively coupled with any component of the laser diagnostic device 100. In some embodiments, the controller 116 controls, drives, or actuates one or more components of the system such as, but not limited to a delay line (e.g., see FIG. 2). In some embodiments, the controller 116 receives data from one or more components of the laser diagnostic device 100 such as, but not limited to, the detector 112. Further, the controller 116 may one or more analysis or processing steps on data received from the detector 112 such as, but not limited to, determining one or more characteristics of the input pulse 104 based on the data from the detector 112.

The one or more processors 118 of a controller 116 may include any processing element known in the art. In this sense, the one or more processors 118 may include any microprocessor-type device configured to execute algorithms and/or instructions. Further, the memory 120 may include any storage medium known in the art suitable for storing program instructions executable by the associated one or more processors 118. For example, the memory 120 may include a non-transitory memory medium. As an additional example, the memory 120 may include, but is not limited to, a read-only memory (ROM), a random-access memory (RAM), a magnetic or optical memory device (e.g., disk), a magnetic tape, a solid-state drive and the like. It is further noted that memory 120 may be housed in a common controller housing with the one or more processors 118.

In some embodiments, the laser diagnostic device 100 includes a user interface 122 that is communicatively coupled to the controller 116 for the purposes of system control and/or display of system outputs. In one embodiment, the user interface 122 may include, but is not limited to, one or more desktops, laptops, tablets, or the like. In another embodiment, the user interface 122 includes a display used to display data of the laser diagnostic device 100 to a user. The display of the user interface 122 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 122 is suitable for implementation in the present disclosure. In another embodiment, a user may input selections and/or instructions responsive to data displayed to the user via a user input device of the user interface 122.

The systems and methods disclosed herein provide multiple benefits over existing techniques.

For example, the systems and methods disclosed herein provide for a single-shot measurement geometry. While other techniques for characterizing the electric field (e.g. TIPTOE) require scanning the time delay between two pulses (and are thus impacted by instability in the laser source), the systems and methods disclosed herein allow measurements to be performed for a single laser shot.

By way of another example, the systems and methods disclosed herein provide for a simplified detection scheme. Other techniques are typically based on the use of phase-matched nonlinear crystals for frequency conversion, and optical detection. In contrast, the systems and methods disclosed herein are more versatile, allowing for optical detection using crystals without phase matching or electrical detection via photoconductivity in commercial CCD detectors or photodiodes.

By way of another example, the systems and methods disclosed herein provide for insensitivity to laser wavelength. Prior techniques are limited by the phase-matching conditions of nonlinear crystals, and therefore are applicable only in specific wavelength ranges (typically the near-infrared). In contrast, the systems and methods disclosed herein can be used to characterize pulses ranging from the UV into the long-wave infrared and THz spectral regions, by using different detectors.

By way of another example, the systems and methods disclosed herein provide for measurements without the use of a pulse retrieval algorithm. Prior techniques have required the development of complex algorithms to retrieve the laser pulse intensity envelope from a measurement. The software can introduce errors in the pulse measurement when used by a novice. In contrast, the systems and methods disclosed herein may directly provide the electric field with only simple mathematical operations (subtraction of a reference signal and division by a calibration signal).

By way of another example, the systems and methods disclosed herein provide for sensitivity to electric field with relatively low pulse intensities. In contrast, most prior techniques for characterizing laser pulses (e.g. FROG) are sensitive to the laser intensity envelope only, and not the electric field oscillations. Further, gas-based TIPTOE techniques typically require pulse intensities on the order of 10-100 $TW/cm^2$, whereas the solid-state based technique disclosed herein may be performed with lower pulse intensities such as, but not limited to, 0.1-1 $TW/cm^2$ or lower.

Figure 2:
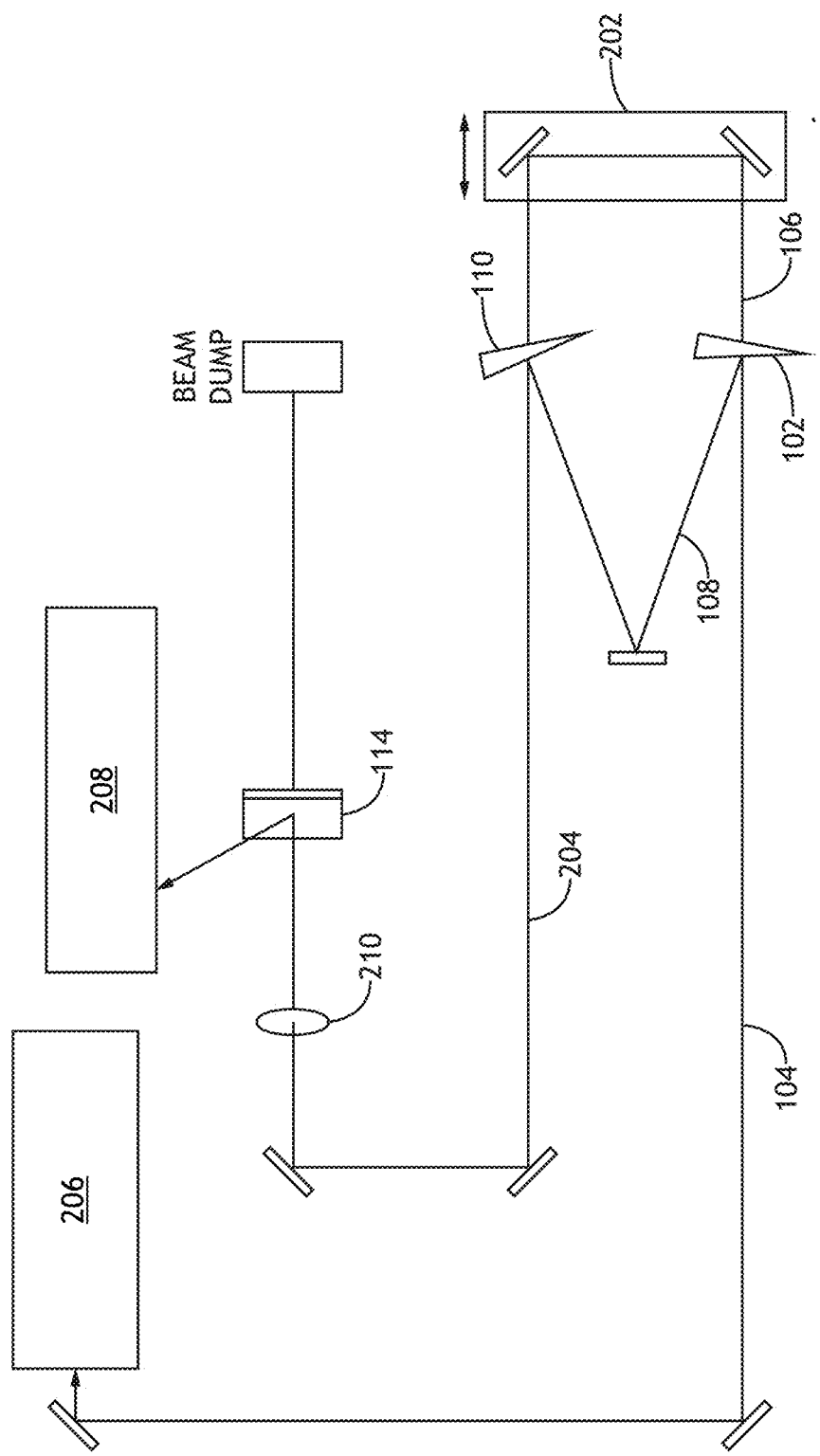
FIG. 2 is a conceptual schematic view of the laser diagnostic device configured for scanning-based measurements, in accordance with one or more embodiments of the present disclosure.
Figure 3:
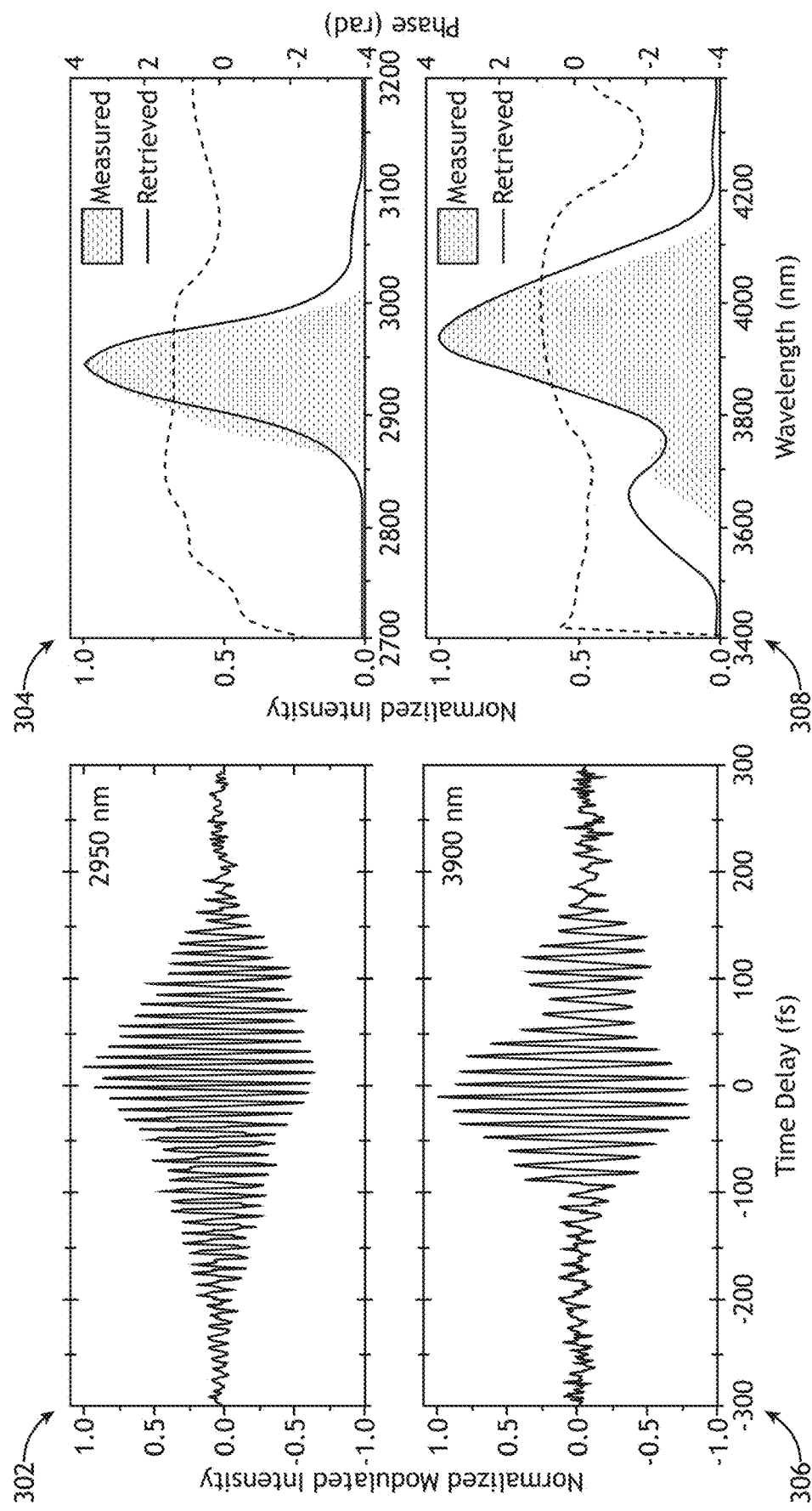
FIG. 3 is a series of plots illustrating the application of the laser diagnostic device of FIG. 2 to characterize multi-cycle mid-infrared input pulses centered at 2.95 and 3.9 μm, in accordance with one or more embodiments of the present disclosure.
Figure 4:
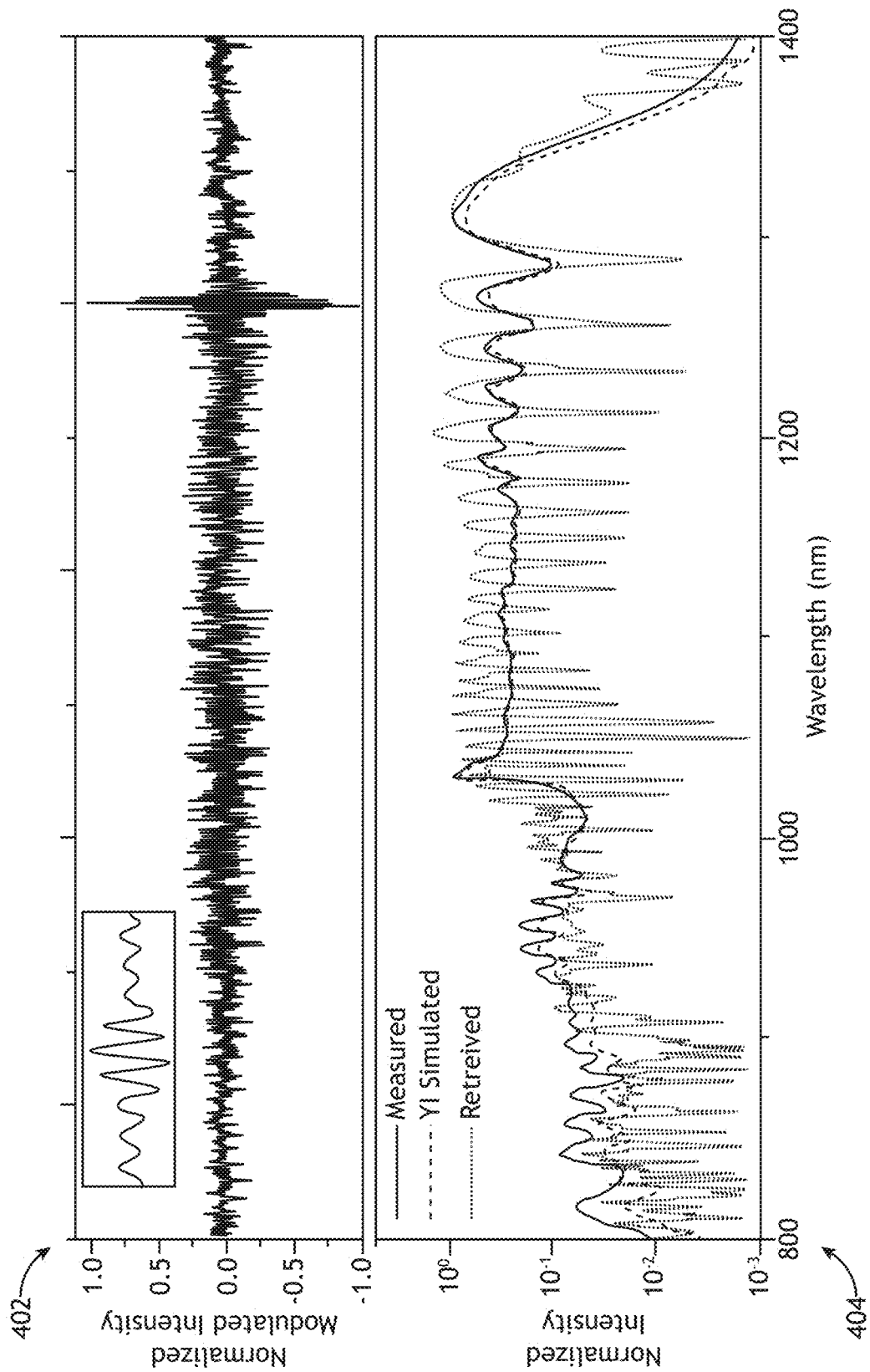
FIG. 4 is a series of plots illustrating the application of the laser diagnostic device of FIG. 2 to characterize near-infrared, few-cycle input pulses centered at approximately 1.1 μm, in accordance with one or more embodiments of the present disclosure.

Referring now to FIGS. 2-11, various non-limiting implementations of the systems and methods for ultrashort pulse characterization disclosed herein are described in greater detail in accordance with one or more embodiments of the present disclosure. In particular, FIGS. 2-4 illustrate a scanning-based configuration and FIGS. 5-11 illustrate a single-shot configuration. Scanning-based ultrashort pulse characterization is described generally in Y. Liu, et al., "All-optical sampling of few-cycle infrared pulses using tunneling in a solid," Phot. Res. 9 (6), 929-936 (2021), which is incorporated herein by reference in its entirety. Single-shot ultrashort pulse characterization is described generally in Y. Liu, et al., "Single-shot measurements of few-cycle optical waveforms on a chip," Nat. Photonics 16, 109-112 (2022) and associated supplementary information for this publication, all of which is incorporated herein by reference in its entirety.

FIG. 2 is a conceptual schematic view of the laser diagnostic device 100 configured for scanning-based measurements, in accordance with one or more embodiments of the present disclosure. Further, the particular illustration of the laser diagnostic device 100 in FIG. 2 is configured for the characterization of both near- and mid-infrared input pulses 104, though it is to be understood that that is solely for the purposes of illustration and should not be interpreted as limiting.

In some embodiments, the laser diagnostic device 100 includes a beamsplitter 102 to split an input pulse 104 into a fundamental pulse 106 and a perturbing pulse 108, an adjustable delay line 202, and beam-combining optics 110 to combine the fundamental pulse 106 and perturbing pulse 108 along a common optical path 204. The delay line 202 may be in an optical path of either the fundamental pulse 106 or the perturbing pulse 108 an may generally provide an adjustable temporal delay between the fundamental pulse 106 and perturbing pulse 108. In FIG. 2, the input pulse 104 is shown as being provided from a source 206, though the input pulse 104 may generally be derived in any way.

The beamsplitter 102 and the beam-combining optics 110 may include any optical components known in the art suitable for splitting and combining light including, but not limited to, coated or uncoated optics. For example, FIG. 2 illustrates both the beamsplitter 102 and the beam-combining optics 110 as optical wedges.

Further, the relative intensities of the fundamental pulse 106 and the perturbing pulse 108 (e.g., provided by a splitting ratio of the beamsplitter 102) is generally adjustable. However, as described throughout the present disclosure, the intensity of the fundamental pulse 106 should be high enough to induce non-linear absorption processes in the solid-state material 114 on its own, whereas the intensity of the perturbing pulse 108 should be low enough that it does not induce non-linear absorption processes in the solid-state material 114 on its own. Rather, the intensity of the perturbing pulse 108 should should be set at a level at which the perturbing pulse 108 modulates the non-linear absorption of the fundamental pulse 106 in the solid-state material 114.

In some embodiments, the detector 112 includes a solid-state material 114 to receive the fundamental pulse 106 and the perturbing pulse 108, and further includes a sensor 208 to capture light emanating from the solid-state material 114. Additionally, as illustrated in FIG. 2, the laser diagnostic device 100 may include one or more lenses 210 and/or mirrors to focus the fundamental pulse 106 and the perturbing pulse 108 onto the solid-state material 114 to induce non-linear absorption.

It is contemplated herein that a wide variety of solid-state material 114 and associated sensors 208 may be utilized and that the selection thereof may be influenced by factors such as, but not limited to the wavelength of the input pulse 104.

In some embodiments, the solid-state material 114 includes a ZnO crystal. It is contemplated herein that nonlinear absorption of an input pulse 104 with a wavelength below the ZnO bandgap may induce a band fluorescence (e.g., at around 390 nm). In this way, the intensity of the band fluorescence as a function of wavelength (e.g. the spectral intensity) induced by non-linear absorption of the fundamental pulse 106 may be modulated by the perturbing pulse 108 and may thus encode information about the electric field of the perturbing pulse 108 (and correspondingly the input pulse 104).

In particular, tunneling and multiphoton excitation in a dielectric solid can provide an ultrafast temporal gate for pulse characterization, which also allows the direct measurement of electric field waveforms. Since the bandgap energies of solids are typically smaller than the ionization potentials of inert gases, the required intensity for excitation in a solid is much lower than for ionization of an inert gas. For ZnO with a bandgap energy of 3.2 eV, the required intensity for inducing nonlinear absorption is less than 1 TW/cm2. The measurement is facilitated by all-optical detection of the visible band fluorescence emission from the surface of ZnO. Importantly, the systems and methods disclosed herein can be easily extended to single-shot and "on-chip" detection schemes, which is expected to be a very simple, convenient, and reliable way for characterizing the infrared waveforms.

Accordingly, the sensor 208 may include a spectrometer to capture the band fluorescence from the solid-state material 114 as a function of a relative time delay between the fundamental pulse 106 and the perturbing pulse 108. For example, the controller 116 may adjust this relative time delay by controlling the delay line 202 via control signals. The controller 116 may then generate various measurements of the input pulses 104 such as, but not limited to, the through one or more analysis steps including, but not limited to, taking the Fourier transforms of the modulated waveforms.

FIGS. 3 and 4 illustrate experimental demonstrations of the laser diagnostic device of FIG. 2.

FIG. 3 is a series of plots illustrating the application of the laser diagnostic device 100 of FIG. 2 to characterize multi-cycle mid-infrared input pulses 104 centered at 2.95 and 3.9 µm, in accordance with one or more embodiments of the present disclosure. For this non-limiting illustration, the photon energy of the input pulses 104 are much lower than the bandgap energy of ZnO (the solid-state material 114) and the Keldysh parameter is <1 at the intensities of ~1 TW/cm$^2$, which indicates the excitation of conduction band electrons proceeds mainly through tunneling. Further, the beamsplitter 102 and the beam-combining optics 110 include uncoated CaF$_2$ wedges to split each input pulse 104 into an intense fundamental pulse 106 and a weak perturbing pulse 108 ~85% and 0.1% of the incident energy, respectively. The spatially overlapped beams are then focused by a spherical lens 210 onto a 0.3-mm-thick c-cut ZnO (the solid-state material 114), and the generated band fluorescence is collected at oblique incidence by a fiber-coupled spectrometer (the sensor 208). The time delay between the fundamental pulse 106 and the perturbing pulse 108 is controlled by a piezo stage installed in an arm with the fundamental pulse 106 and calibrated using interference from a 532 nm pilot laser that propagates with both the fundamental pulse 106 and the fundamental pulse 106.

The modulation of the band fluorescence corresponding to the 2.95 and 3.9 µm pulses are displayed in plot 302 and plot 306, respectively. By taking the Fourier transforms of the modulated waveforms (e.g., with the controller 116), the spectra and spectral phases can be found, which are plotted together with an independently-measured spectrum (shaded area) obtained with a PbSe detector-based spectrometer (the sensor 208) in plots 304 and 308. The good agreement between the measured and retrieved spectrum suggests that measurement of the modulated perturbations is a reliable for characterizing mid-infrared pulses.

FIG. 4 is a series of plots illustrating the application of the laser diagnostic device 100 of FIG. 2 to characterize near-infrared, few-cycle input pulses 104 centered at ~1.1 µm, in accordance with one or more embodiments of the present disclosure. In this non-limiting illustration, the input pulses 104 are generated by chirped mirror compression of a N$_2$O-filled hollow core capillary broadened supercontinuum. Since the Keldysh parameter is >1, the excitation of carriers is expected to arise primarily from three-photon absorption.

Plot 402 displays the modulation of the band-fluorescence from the ZnO solid-state material 114 collected by a spectrometer (the sensor 208), which contains a two-cycle electric field near the time delay 0. Further, a very weak tail persists for ~600 fs at negative time delays. After taking the Fourier transform of the modulated waveform (e.g., with the controller 116), the spectrum is obtained and plotted in plot 404. By comparing the spectrum received from the modulated perturbations with the spectrum measured by the spectrometer, we find that the retrieved spectrum below 960 nm is weaker than the measured spectrum. To clarify this, the excitation process was simulated using the Yudin-Ivanov (YI) model of ionization, which is valid in both the tunneling and multiphoton regimes. Indeed, the short wavelength component of the simulated retrieved spectrum is weaker than the measured spectrum, in good agreement with the spectrum retrieved from the measurements.

Referring generally to FIGS. 2-4, it is to be understood that FIGS. 2-4 and the associated descriptions are provided solely for illustrative purposes and should not be interpreted as limiting. For example, the detector 112 is not limited to a ZnO solid-state material 114 and associated spectral sensor 208. For example, any solid-state material 114 providing emission based on non-linear absorption may be utilized. In some embodiments, the solid-state material 114 is formed as an image sensor or photodetector. In this way, the detector 112 may directly generate an electrical current in response to non-linear absorption of the fundamental pulse 106 and the perturbing pulse 108 such that no separate sensor 208 is required. For example, the detector 112 may include, but is not limited to, a Si-based charge couple device (CCD) or complementary metal-oxide-semiconductor (CMOS) image sensor for midIR detection. For visible and shorter-wavelength detection, the detector 112 may include, but is not limited to, a GaP or AlGaN photodiode.

Referring now to FIGS. 5-7, single-shot measurements are described in greater detail, in accordance with one or more embodiments of the present disclosure.

Figure 5A:
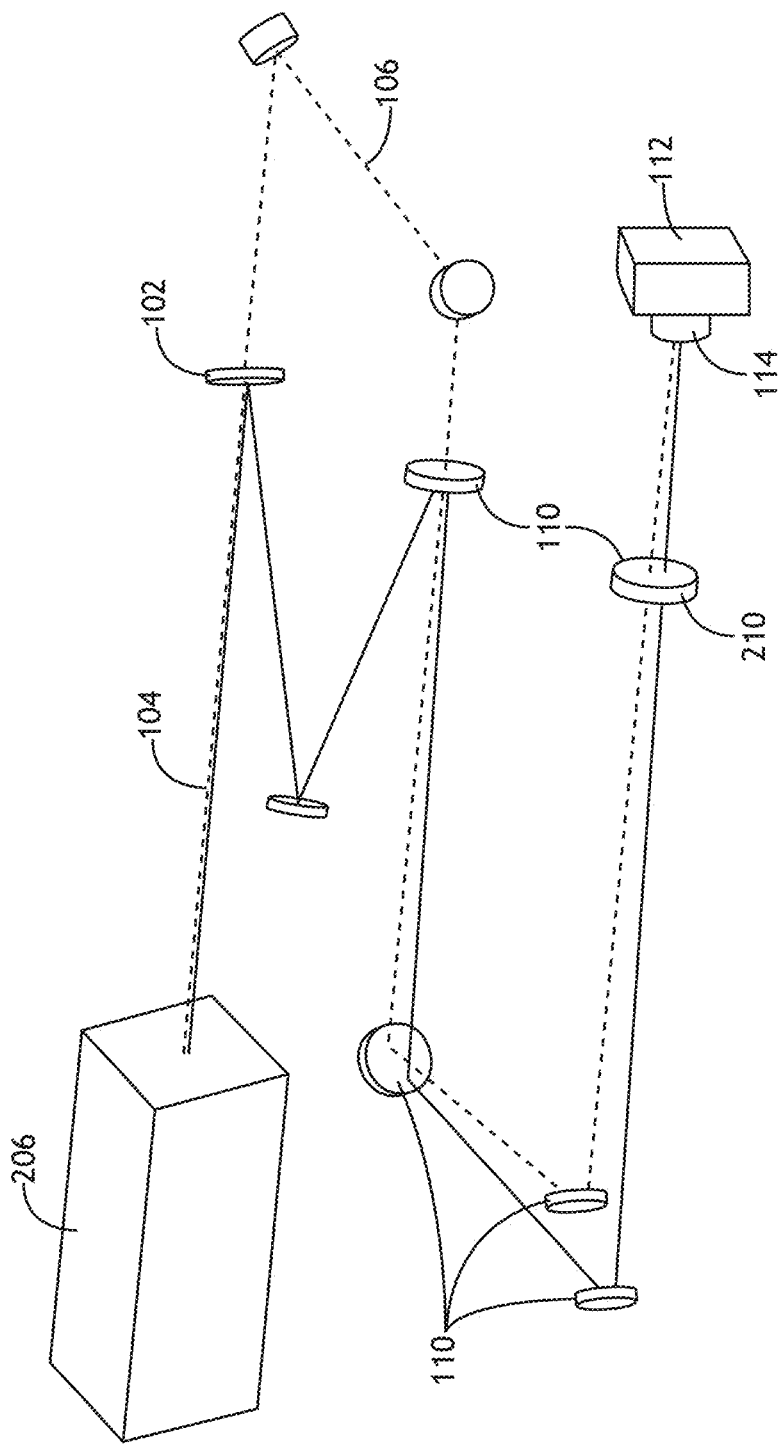
FIG. 5A is a conceptual schematic view of the laser diagnostic device configured for single-shot measurements, in accordance with one or more embodiments of the present disclosure.

FIG. 5A is a conceptual schematic view of the laser diagnostic device 100 configured for single-shot measurements, in accordance with one or more embodiments of the present disclosure.

Figure 5B:
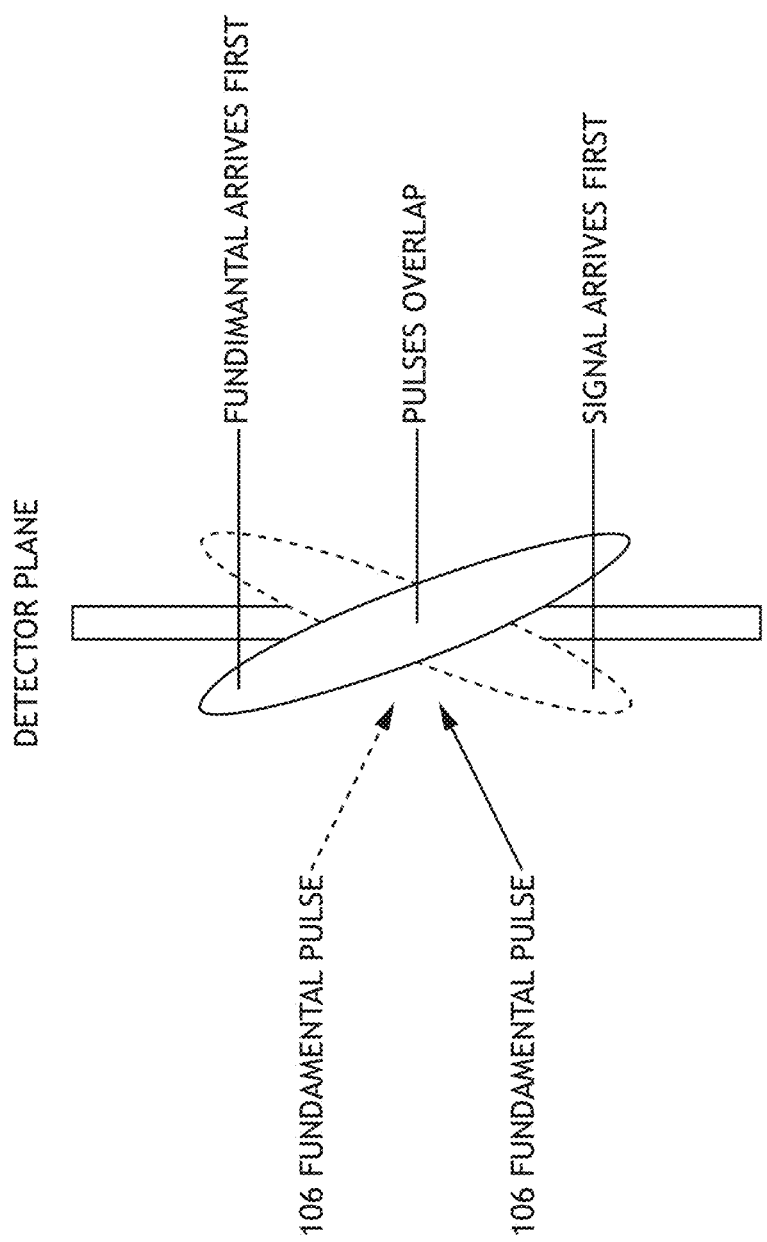
FIG. 5B is a conceptual schematic illustrating a crossed layout of the fundamental pulse and the perturbing pulse on the detector, in accordance with one or more embodiments of the present disclosure.

In some embodiments, the laser diagnostic device 100 includes a beamsplitter 102 arranged to split an input pulse 104 into a fundamental pulse 106 and a perturbing pulse 108 as described with respect to FIG. 2. However, in this configuration, the beam-combining optics 110 are arranged such that the fundamental pulse 106 and the perturbing pulse 108 temporally and spatially overlapped in a cross geometry at the detector 112. For example, the beam-combining optics 110 may include one or more cylindrical lenses (or reflective optics) to focus the fundamental pulse 106 and the perturbing pulse 108 to a crossed line pattern. FIG. 5B is a conceptual schematic illustrating a crossed layout of the fundamental pulse 106 and the perturbing pulse 108 on the detector 112, in accordance with one or more embodiments of the present disclosure.

In some embodiments, the detector 112 includes include an imaging sensor as the solid-state material 114 to directly generate a photocurrent based on the fundamental pulse 106 as perturbed by the perturbing pulse 108 or a nonlinear crystal that emits light (e.g., band fluorescence) in response to the non-linear absorption that may be captured by a separate sensor 208). Further, as described with respect to FIG. 2, various detector 112 selections may be suitable for measurements in different wavelength ranges. In the non-limiting examples herein, the detector 112 includes a silicon-based CCD image sensor. For near-IR and shorter-wavelength detection, the CCD can be replaced with a ZnO crystal, and the spatial variations of the band fluorescence imaged onto a CCD camera, or with a solar-blind detector (e.g. AlGaN photodiode array or image sensor).

Regardless of the particular selection of the detector 112, the cross-geometry illustrated in FIG. 5B allows for single-shot detection of optical electric field waveforms, including the absolute CEP, by mapping the temporal coordinate onto a spatial coordinate using a crossed-beam geometry. For example, a detector 112 with an imaging sensor as the solid-state material 114 may directly provide a spatial read-out through the various pixels. By way of another example, a detector 112 including a non-linear crystal as the solid-state material 114 may include a separate spatially-resolved sensor 208 (e.g., an imaging camera) to capture the spatial distribution of illumination.

Figure 5C:
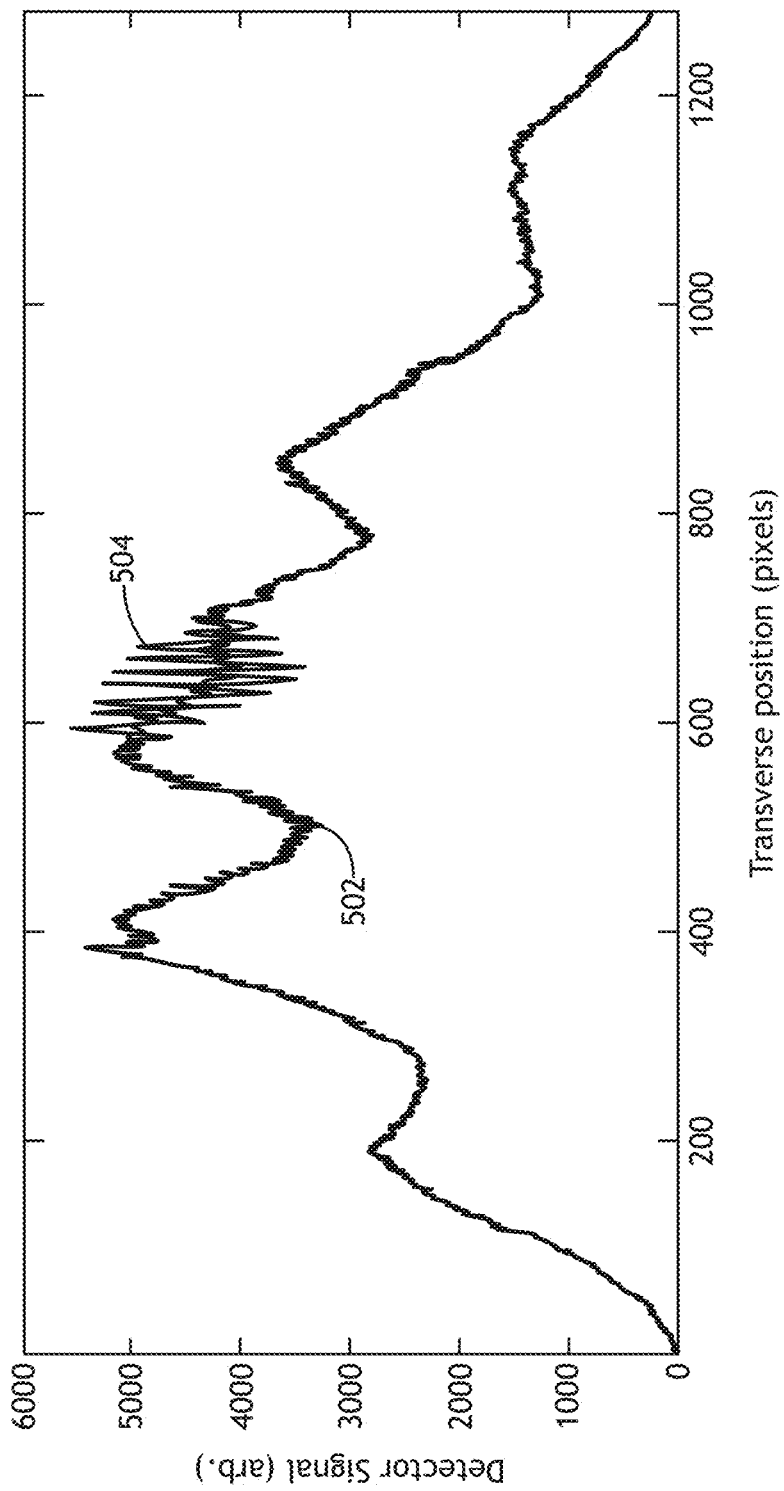
FIG. 5C is a plot illustrating a first detector signal based solely on the fundamental pulse and a second detector signal associated with both the fundamental pulse and the perturbing pulse, in accordance with one or more embodiments of the present disclosure.

FIG. 5C is a plot illustrating a first detector signal 502 based solely on the fundamental pulse 106 and a second detector signal 504 associated with both the fundamental pulse 106 and the perturbing pulse 108, in accordance with one or more embodiments of the present disclosure. As illustrated in FIG. 5C, the perturbation of the first detector signal 502 by the perturbing pulse 108 is evident.

Figure 5D:
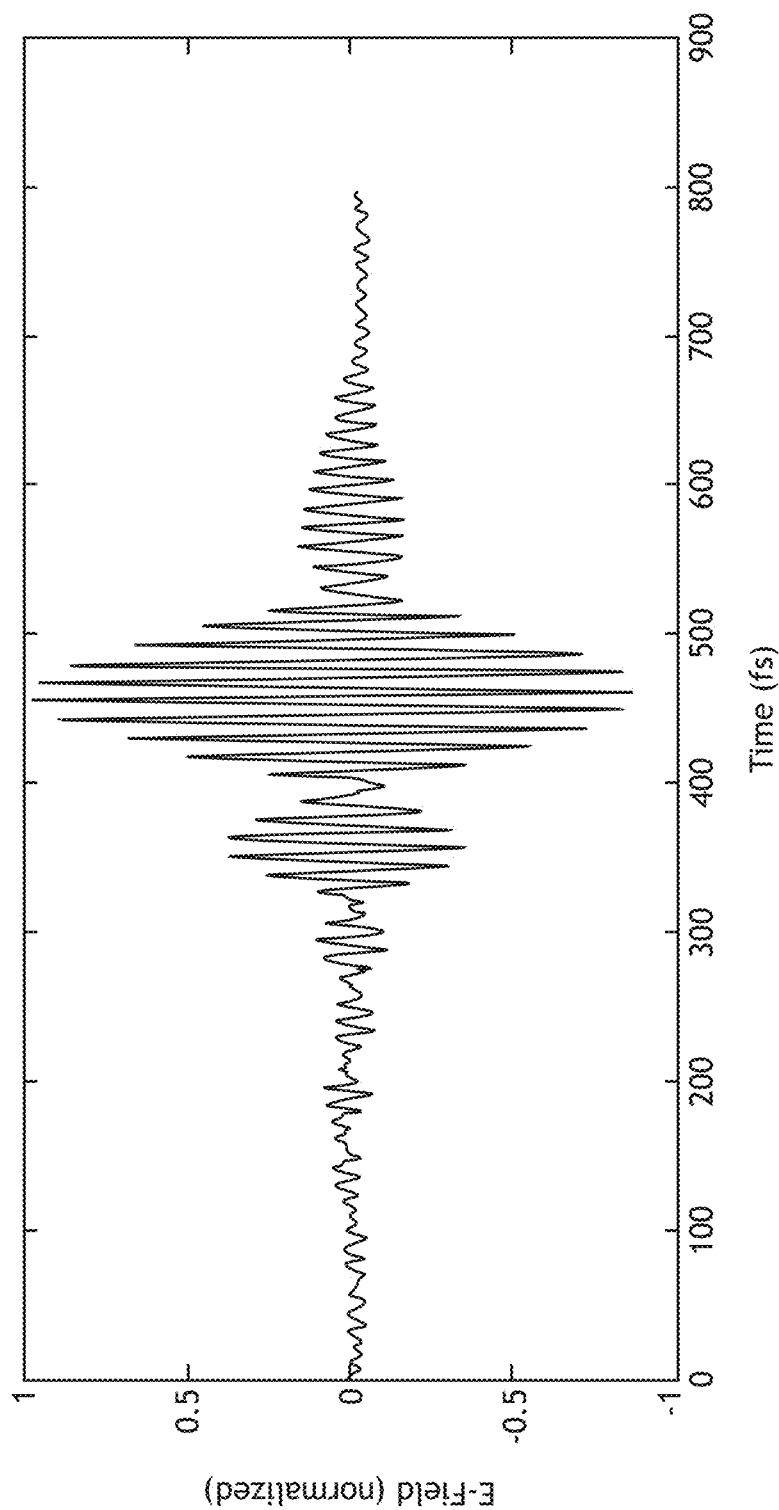
FIG. 5D is a plot of the electric field waveform of the perturbing pulse, in accordance with one or more embodiments of the present disclosure.

FIG. 5D is a plot of the electric field waveform of the perturbing pulse 108 (and thus the input pulses 104), in accordance with one or more embodiments of the present disclosure. For example, the electric field waveform in FIG. 5D may be generated by manipulating the second detector signal 502 to remove the contributions of the fundamental pulse 106 and isolate the contributions of the perturbing pulse 108. For example, the temporal electric field may be, but is not required to be, extracted by performing a subtraction of a reference signal and division by a calibration signal. In this example, a reference signal can be obtained by measuring the detector signal with only the fundamental pulse 106 (i.e. a "fundamental-only" signal) or by applying a low-pass filter to the detector signal measured with both the fundamental pulse 106 and fundamental pulse 106 present, where the calibration signal is a function of the reference signal (e.g., as described in greater detail below).

Figure 6A:
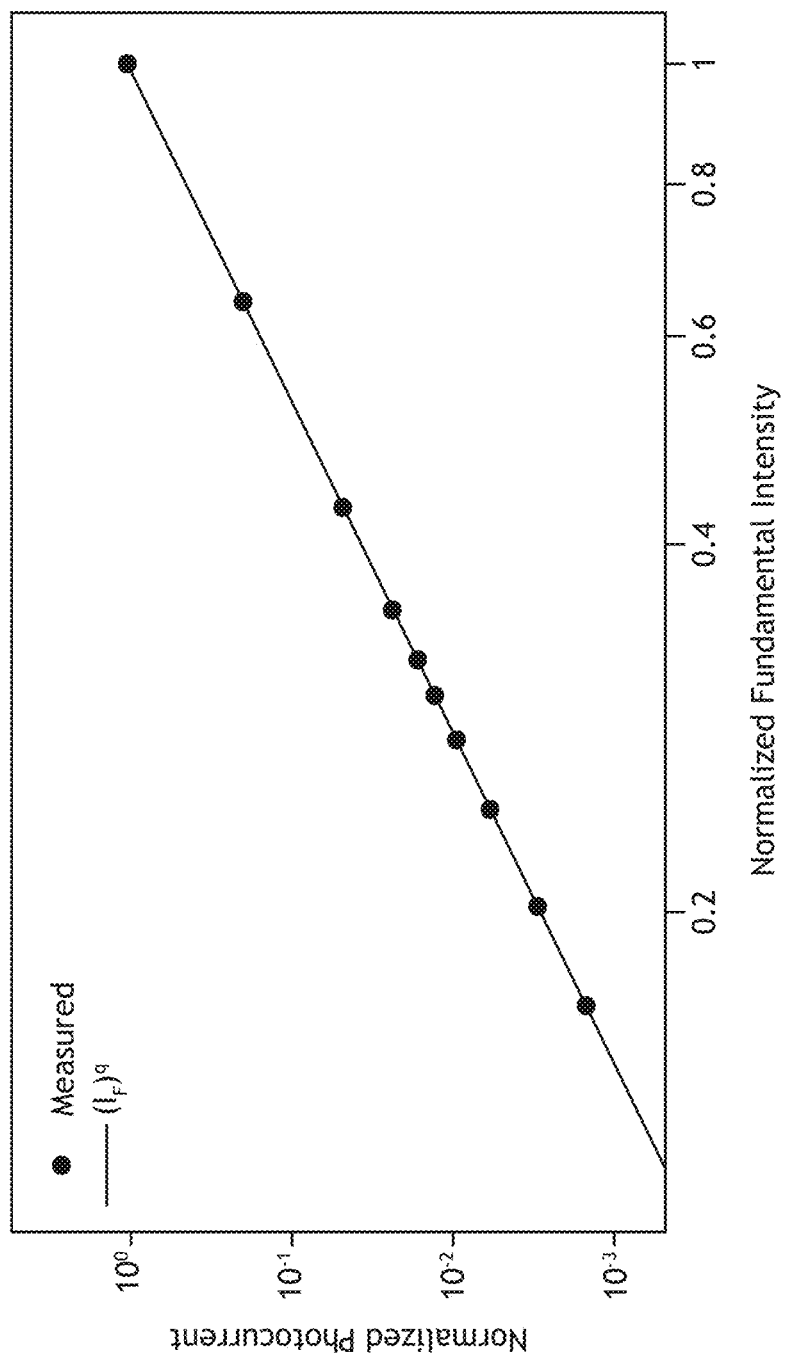
FIG. 6A is a plot of the dependence of the measured photocurrent on the intensity of the fundamental pulse, in accordance with one or more embodiments of the present disclosure.
Figure 6B:
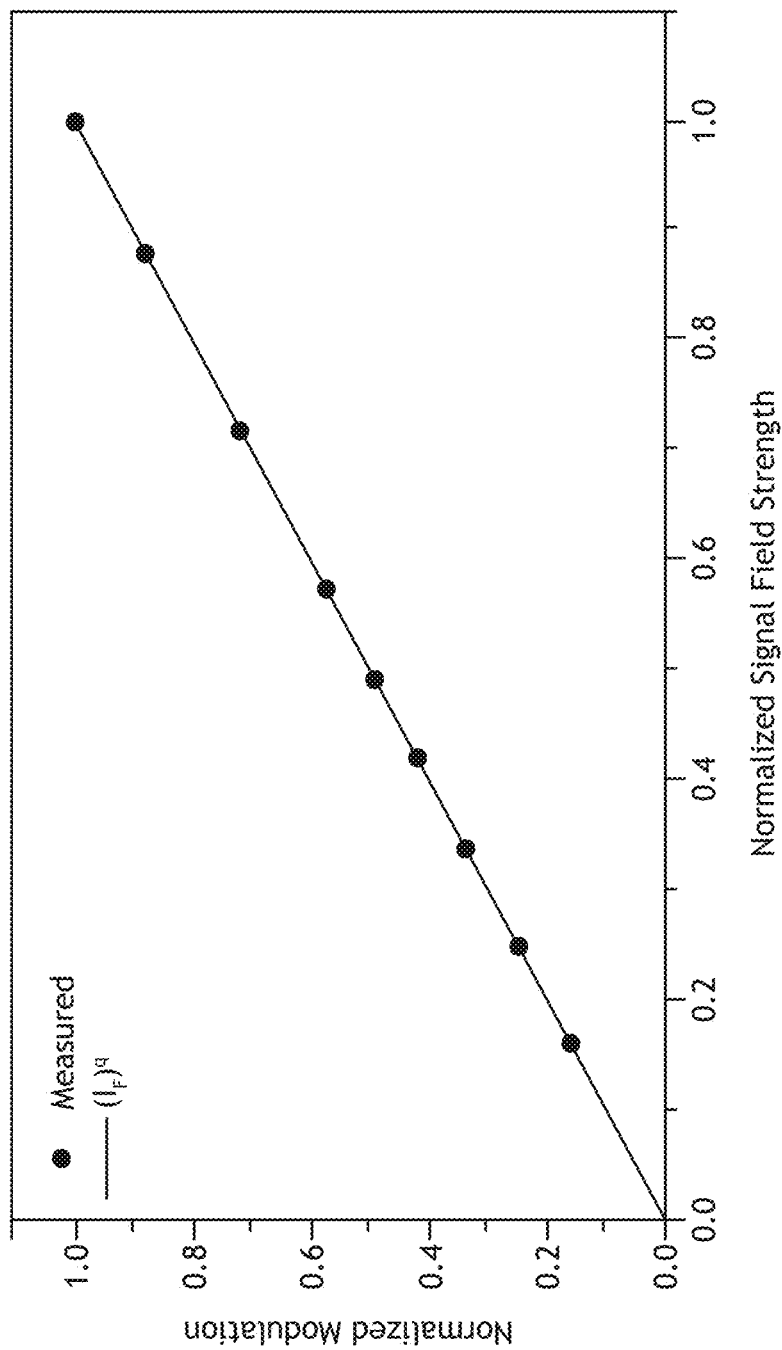
FIG. 6B is a plot of the dependence of the measured photocurrent on the intensity of the perturbing pulse, in accordance with one or more embodiments of the present disclosure.

Further, referring now to FIGS. 6A and 6B, the extraction of the electric field waveform is described in greater detail, in accordance with one or more embodiments of the present disclosure. It is noted that the although the discussion focuses on the specific use of a silicon detector 112, it is to be understood that this is solely for illustrative purposes and is non-limiting. Rather, the concepts may be extended to other selections for the wavelength of the input pulse 104 and the selection of the detector 112.

As described previously herein, an intense fundamental pulse 106 may generate a photocurrent in a solid-state material 114, which may be perturbed by the weak perturbing pulse 108. Because the mid-IR photon energy is much lower than the band gap of the solid-state detector material (here, silicon), the photocurrent can be generated only by nonlinear absorption of valence band electrons into the conduction band.

FIG. 6A is a plot of the dependence of the measured photocurrent on the intensity of the fundamental pulse 106, in accordance with one or more embodiments of the present disclosure. FIG. 6B is a plot of the dependence of the measured photocurrent on the intensity of the perturbing pulse 108, in accordance with one or more embodiments of the present disclosure. From FIG. 6A, it may be observed that the photocurrent signal S obtained from the CMOS sensor follows the expected behavior for multiphoton excitation, $S \propto (I_F)^q$, where $I_F$ is the peak intensity of the fundamental pulse 106 and $q \approx 3.6$ is the effective photon number. From FIG. 6B, it may be observed that, for a particular position on the sensor (i.e., a particular value of the fundamental pulse/perturbing pulse time delay), the perturbed photocurrent signal scales linearly with the electric field amplitude, as is required for reliable characterization of the perturbing pulse 108.

Further, the measured detector signal is proportional to the total excitation fraction $N(\tau)$, measured as a function of the time delay $\tau$ between the fundamental pulse and the perturbing pulse. Due to the crossed-beam geometry, the delay-dependent modulation is mapped on to the spatial profile of the multiphoton excitation signal. However, a challenge arises due to the nonuniformity of the spatial intensity profile of the fundamental pulse, leading to a strong variation of $I_F$ (and therefore the photocurrent signal) across the delay axis. This can be solved by appropriately normalizing the measured detector signal. The excitation fraction can be obtained from the excitation rate w(E), which depends on the instantaneous value of the total electric field E, along with the time-dependent fields of the fundamental pulse 106 and the perturbing pulse 108 $E_F(t)$ and $E_p(t)$, according to $$N(\tau) = \int_{-\infty}^{\infty} w[E_f(t-\tau) + E_P(t)]dt.$$

For a sufficiently weak field of the perturbing pulse 108, the second term can be treated as a perturbation, such that $N(\tau) \approx N_0 + \delta N$. Here, $N_0$ is a constant and $$\delta N = \int \left[\frac{dW}{dE}\bigg|_{E=E_F}\right] E_P(t) dt$$

yields the perturbing modulation. The first derivative of the excitation rate acts as a fast temporal gate which samples the electric field of the perturbing pulse 108. However, the nonuniform spatial profile of the fundamental pulse 106 leads effectively to a spatially dependent scaling factor, as $$\frac{dw}{dE}$$

varies according to the spatial intensity distribution. It can be shown that, in both the multiphoton and tunneling regimes, the first derivative of the excitation rate follows $$\frac{dw}{dE} \propto \frac{w}{I_F}.$$

For multiphoton excitation with $w \propto (I_F)^q$ simplifies further to $$\frac{dw}{dE} \propto w^{\frac{(q-1)}{q}}.$$

This implies that the perturbing pulse 108 can be obtained from the modulated excitation signal, provided that the unmodulated detector signal and the multiphoton parameter q can be measured. In the limit of large q, the perturbing field is simply proportional to the modulation depth.

Figure 7A:
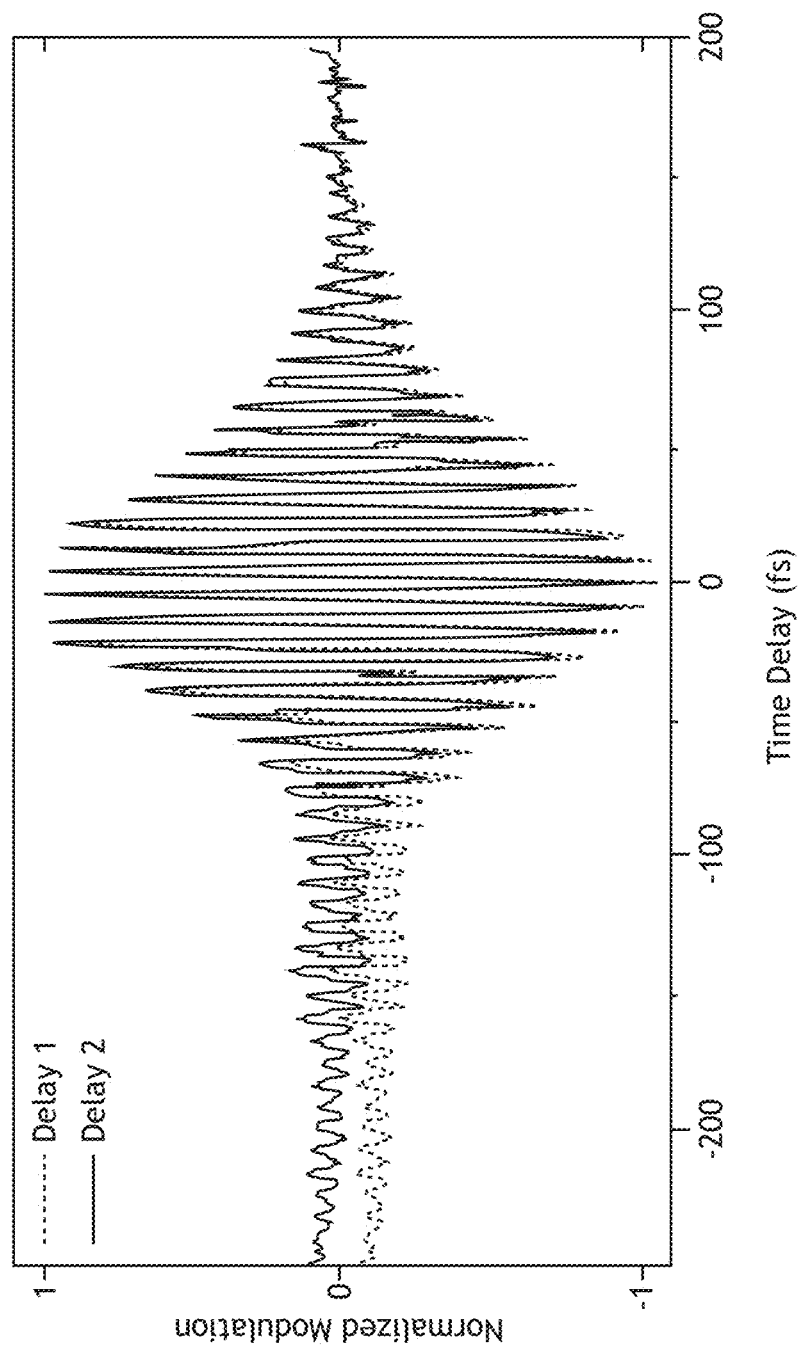
FIG. 7A is a plot of the characterization of mid-IR input pulses with a central wavelength near 3.6 μm and pulse energy of 10 μJ for two delay values, in accordance with one or more embodiments of the present disclosure.

FIG. 7A is a plot of the characterization of mid-IR input pulses 104 with a central wavelength near 3.6 µm and pulse energy of 10 µJ for two delay values, in accordance with one or more embodiments of the present disclosure. The mid-IR input pulses 104 were generated using an optical parametric amplifier pumped by a Yb:KGW amplifier and were split into an intense fundamental pulse 106 and weak perturbing pulse 108, respectively containing ~85% and ~0.1% of the incident energy of the input pulse 104 using a beamsplitter 102 consisting of uncoated CaF$_2$ wedges. The pulses were then recombined with a variable time delay, and focused by a cylindrical lens onto a silicon-based CMOS image sensor (the detector 112). The cylindrical lens results in a line-like focus, and the two beams are combined with an angle of 6.5 degrees such that the time delay ranges from −630 fs to +630 fs across the horizontal dimension of the sensor.

Figure 7B:
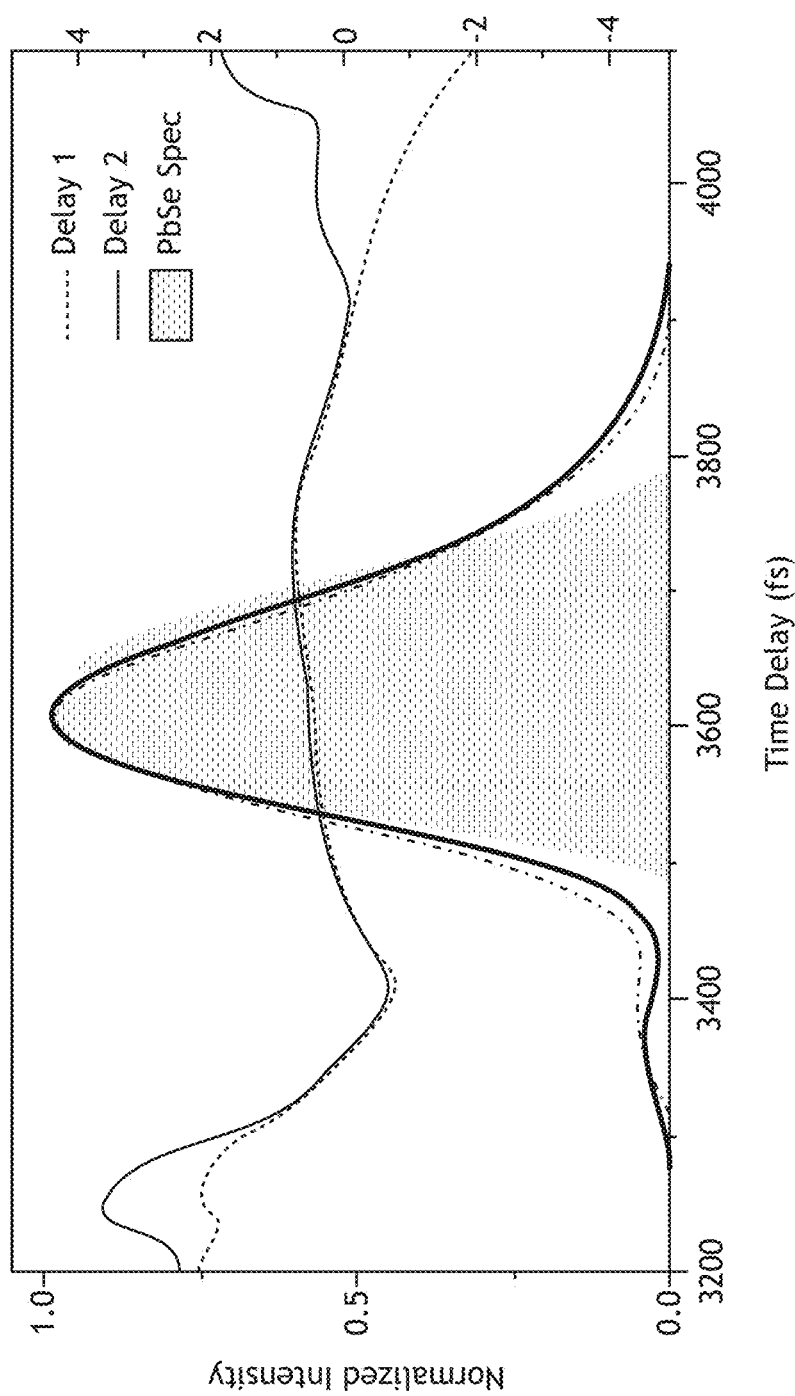
FIG. 7B is a plot of the Fourier transforms of the two waveforms in FIG. 7A, along with the spectrum measured using a PbSe spectrometer as a reference, in accordance with one or more embodiments of the present disclosure.

The retrieved signal field is shown in FIG. 7A for the two different values of the delay between the fundamental pulse 106 and the perturbing pulse 108. As can be seen, the retrieved pulses are nearly identical. FIG. 7B is a plot of the Fourier transforms of the two waveforms in FIG. 7A, along with the spectrum measured using a PbSe spectrometer as a reference, in accordance with one or more embodiments of the present disclosure. The two waveforms yield nearly identical spectral phases and spectra that agree well with the spectrometer measurement.

Referring now to FIGS. 8-11, in some embodiments, the CEP of the input pulse 104 is measured.

It is contemplated herein that the electric field waveform captured based on perturbations of non-linear absorption of the fundamental pulse 106 in a solid-state material 114 by the perturbing pulse 108 may generally reflect the electric-field envelope and the time-dependent phase of the input pulse 104, but does not necessarily provide a waveform measurement (e.g., a CEP measurement of the perturbing pulse 108 and thus the input pulse 104). Rather, the CEP of the electric-field envelope may correspond to a relative CEP between the fundamental pulse 106 and the perturbing pulse 108.

In some embodiments, the CEP of the input pulse 104 is characterized by setting the CEP of the fundamental pulse 106 to zero during a measurement. In this way, the modulation of the detector signal associated with perturbations of the nonlinear absorption in the solid-state material 114 of the detector 112 may correspond to the electric field of the perturbing pulse 108 and thus the electric field of the input pulse 104.

The CEP of the fundamental pulse 106 may be set to zero using any technique known in the art. In some embodiments, the CEP of the fundamental pulse 106 is set to zero by replacing the perturbing pulse 108 with a weak second harmonic field associated with the fundamental pulse 106 and selectively introducing CEP to the fundamental pulse 106. For a sufficiently short pulse with a cosine-like waveform, multiphoton excitation is temporally confined to a single half-cycle at the center of the pulse. In this case, the detector signal will exhibit modulations at the second harmonic frequency. However, for sine-like pulses, or for multi-cycle pulses, the excitation events in adjacent half-cycles will be enhanced and suppressed, respectively, by the addition of the second harmonic pulse, and therefore the modulation at the second harmonic frequency is strongly suppressed, leaving instead a much weaker oscillation at the fourth harmonic of the fundamental field. In this way, the CEP of the fundamental pulse 106 can be set to zero simply by maximizing the amplitude of the second harmonic modulation.

Accordingly, once the CEP of the fundamental pulse 106 is set to zero, the CEP associated with the electric field modulation (e.g., as described with respect to FIGS. 2-7) with the perturbing pulse 108 may correspond to the CEP of the perturbing pulse 108 and thus the input pulse 104.

Figure 8:
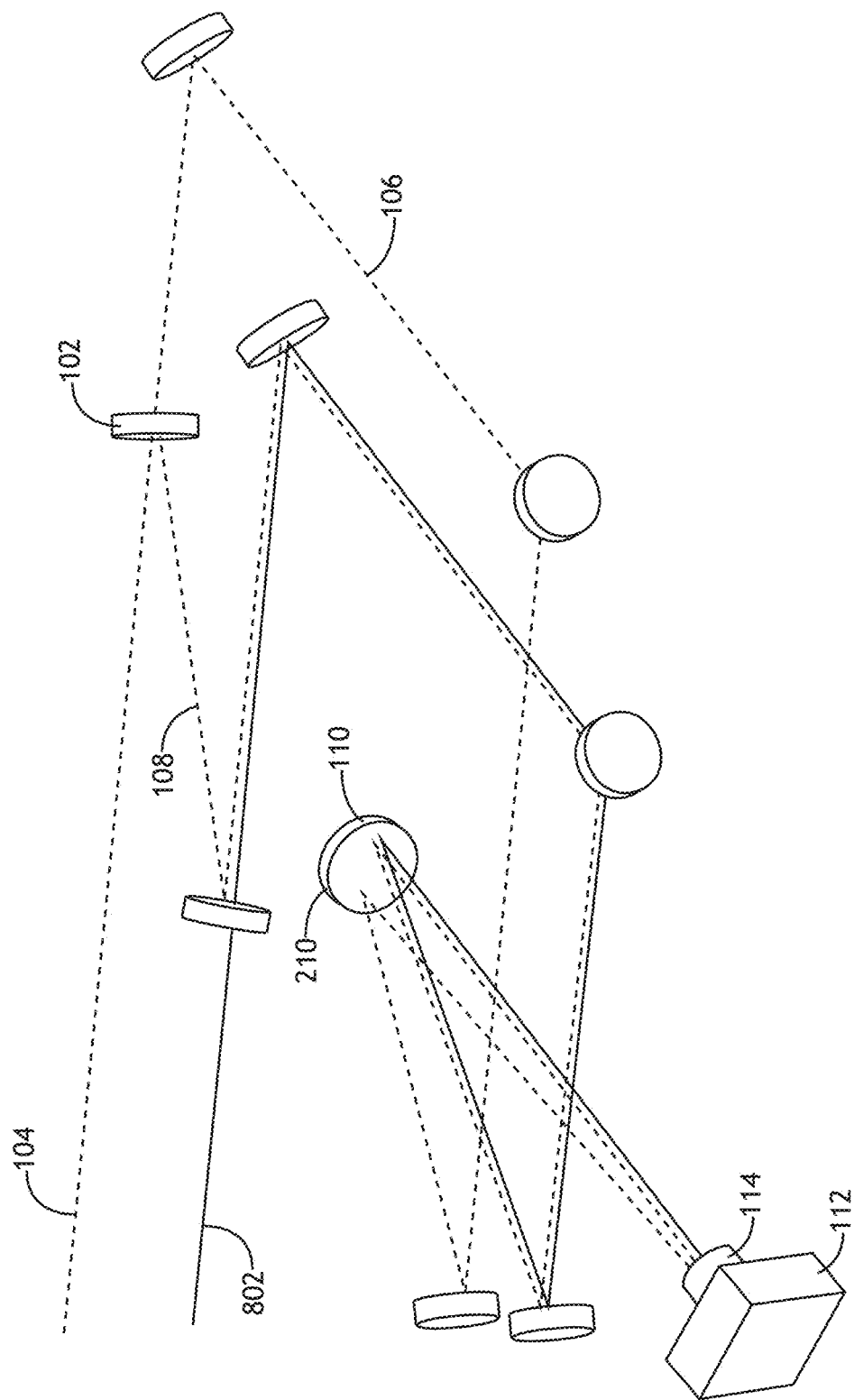
FIG. 8 is a conceptual schematic view of the laser diagnostic device configured for single-shot measurements and carrier envelope phase (CEP) characterization, in accordance with one or more embodiments of the present disclosure.

FIG. 8 is a conceptual schematic view of the laser diagnostic device 100 configured for single-shot measurements and CEP characterization, in accordance with one or more embodiments of the present disclosure.

In some embodiments, the laser diagnostic device 100 temporarily provides a SHG pulse 802 in place of the perturbing pulse 108 for the purposes of setting the CEP of the fundamental pulse 106 to zero. The SHG pulse 802 may be generated using any technique known in the art including, but not limited to, splitting the input pulse 104 using an additional beamsplitter prior to the beamsplitter 102 illustrated in FIGS. 2 and 5A to generate a secondary beam and then propagating the secondary beam through a non-linear medium to generate the SHG pulse 802. Subsequently, the CEP of the fundamental pulse 106 can be set to zero simply by adjusting the CEP of the fundamental pulse 106 to a point that maximizes the amplitude of the second harmonic modulation in the detector 112. For example, the CEP may be selectively controlled by varying the thickness of a CaF$_2$ wedge pair placed in an optical path of the fundamental pulse 106 (e.g., before or after the beamsplitter 102).

Referring now to FIGS. 9A-11, non-limiting illustrations of measurements generated using the laser diagnostic device 100 in FIG. 8 are described, in accordance with one or more embodiments of the present disclosure.

Figure 9A:
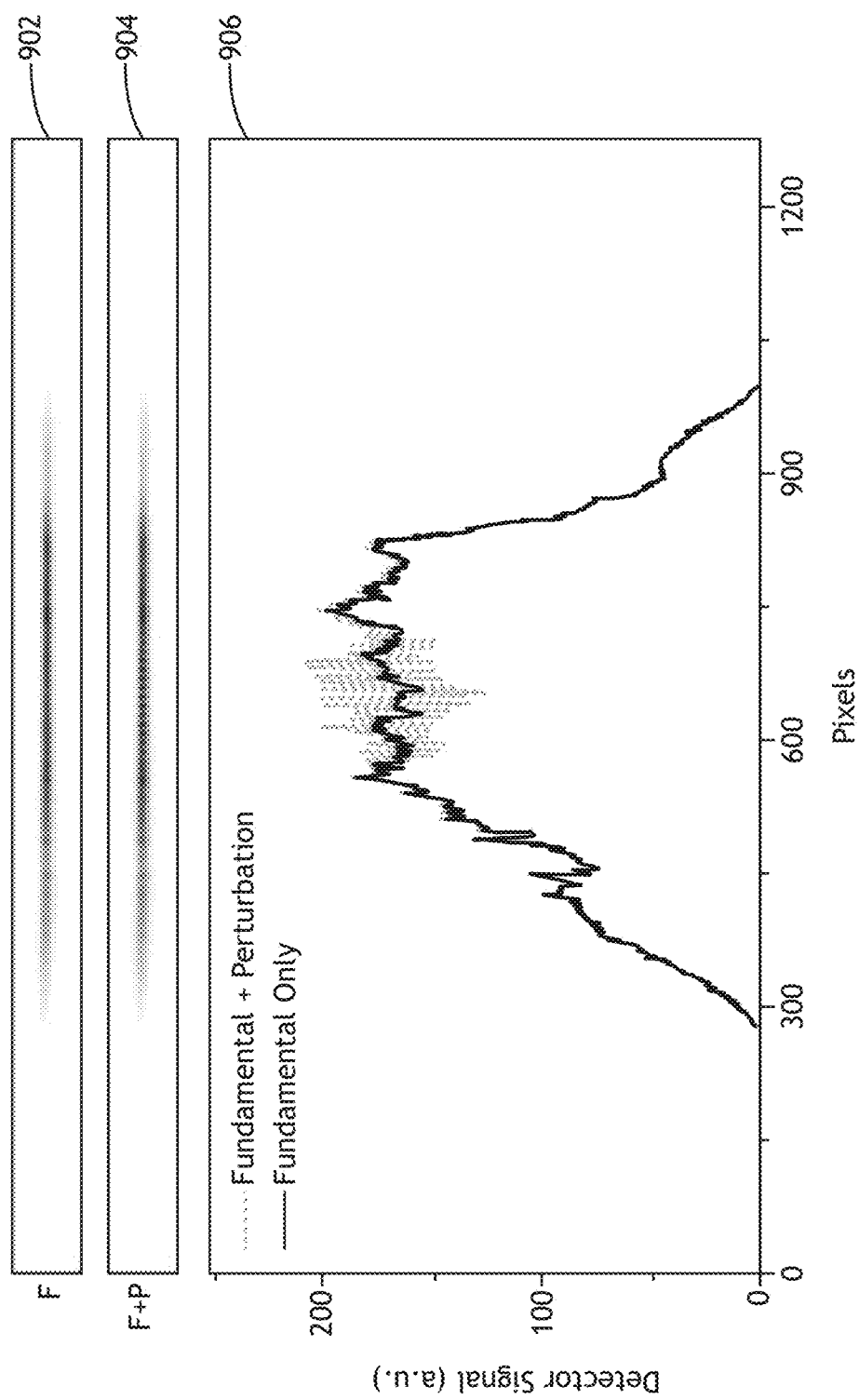
FIG. 9A includes an image from the detector of FIG. 8 generated using a single fundamental pulse, an image associated with both a fundamental pulse and the perturbing pulse, and a plot illustrating line-outs of the images, in accordance with one or more embodiments of the present disclosure.

FIG. 9A includes an image 902 from the detector 112 of FIG. 8 generated using a single fundamental pulse 106, an image 904 associated with both a fundamental pulse 106 and the perturbing pulse 108, and a plot 906 illustrating line-outs of the images, in accordance with one or more embodiments of the present disclosure. In FIG. 9A, both the fundamental pulse 106 and the fundamental pulse 106 have a wavelength of 3.4 microns and are multi-cycle pulses.

As illustrated in FIG. 9A, the perturbation of the detector signal by the perturbing pulse 108 is clearly visible, even for a single shot measurement.

Figure 9B:
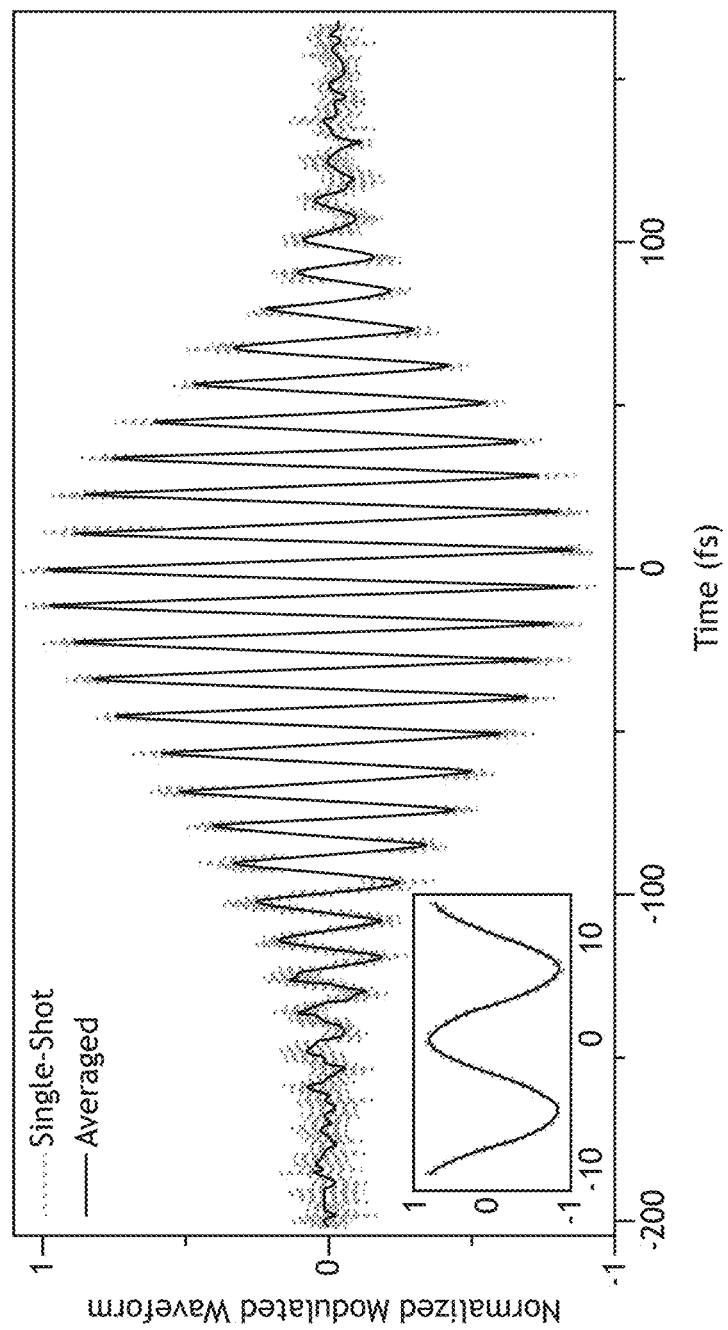
FIG. 9B is plot of the measured modulation waveform from FIG. 9A after isolating the perturbations induced by the perturbing pulse, in accordance with one or more embodiments of the present disclosure.

FIG. 9B is plot of the measured modulation waveform from FIG. 9A after isolating the perturbations induced by the perturbing pulse 108, in accordance with one or more embodiments of the present disclosure. Further, FIG. 9B shows both single-shot and averaged data and illustrates a high accuracy and clear signal generated during the single shot measurement. In particular, FIG. 9B illustrates 10 overlapping single-shot measurements along with an average of those measurements.

Figure 9C:
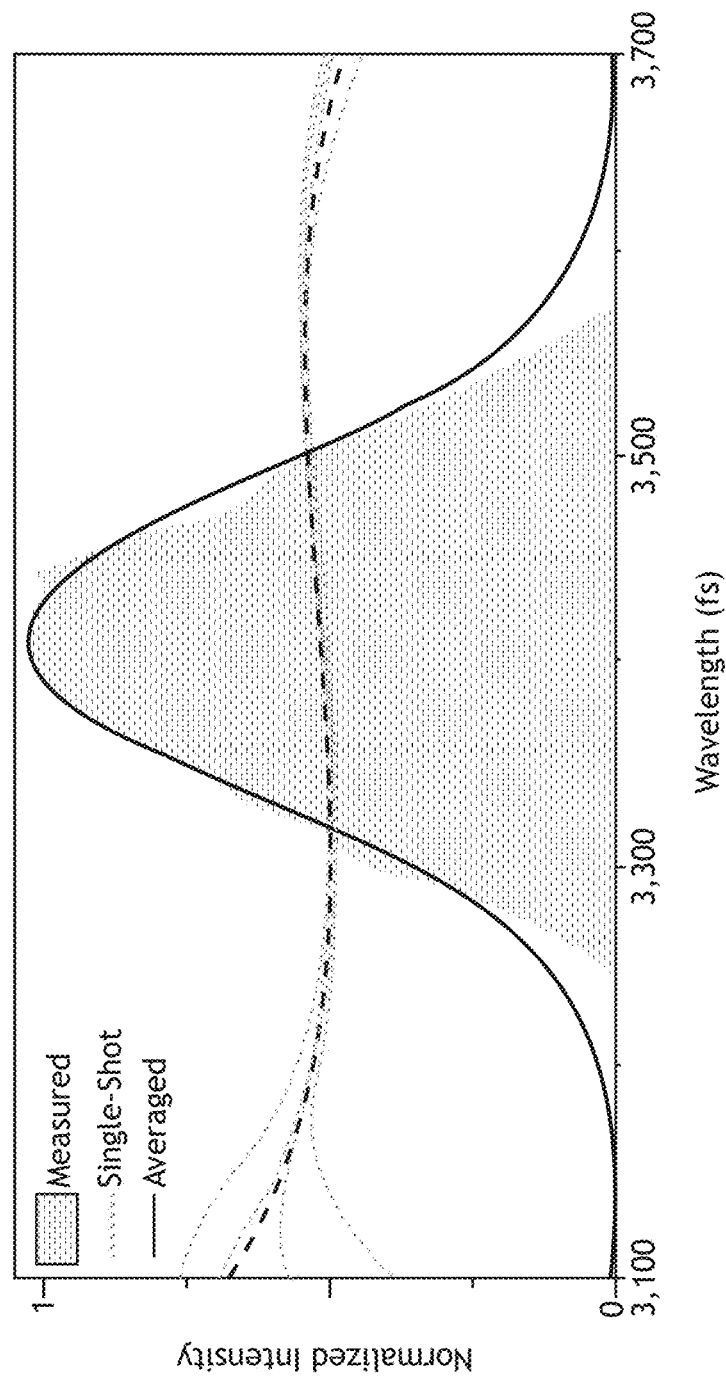
FIG. 9C is a plot of the spectra and spectral phases of the perturbing pulse generated from FIG. 9D, in accordance with one or more embodiments of the present disclosure.

FIG. 9C is a plot of the spectra and spectral phases of the perturbing pulse 108 (and thus the input pulse 104) generated from FIG. 9D, in accordance with one or more embodiments of the present disclosure. FIG. 9C further includes a reference measurement from an external PbSe detector to verify the measurements generated by the laser diagnostic device 100. As illustrated in FIG. 9C, the measurements by the laser diagnostic device 100 are in excellent agreement with the independent measurements.

Figure 10A:
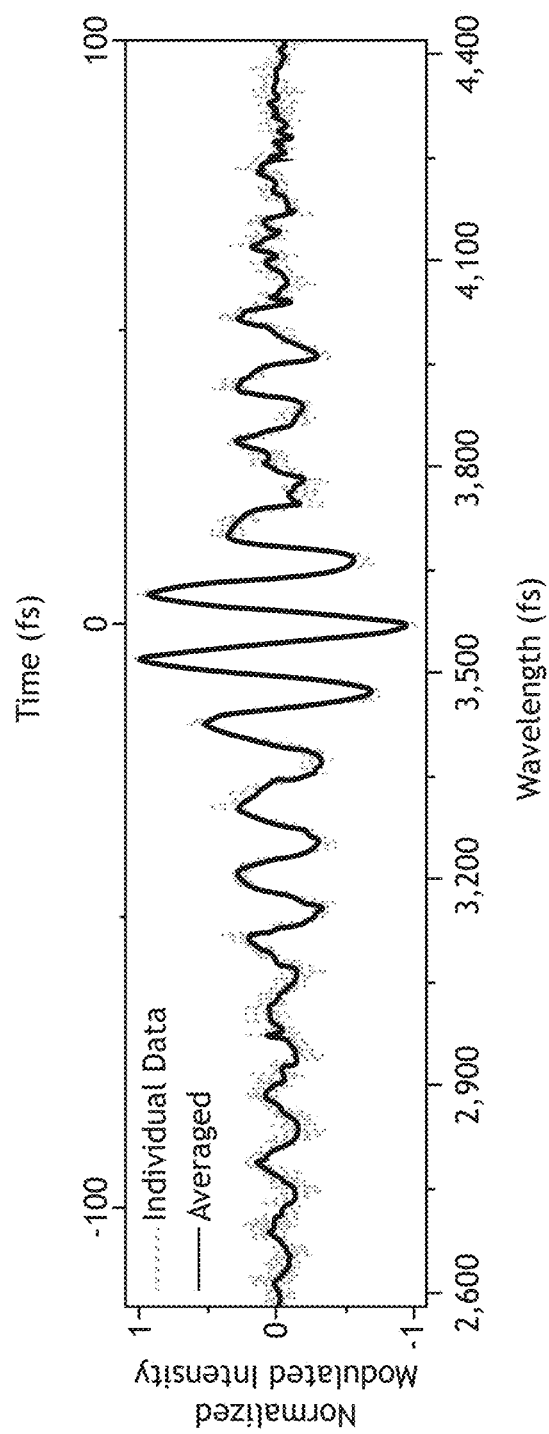
FIG. 10A is a plot of a modulation waveform associated with a 2.1-cycle mid-IR pulse generated using non-linear compression as measured by the laser diagnostic device illustrated in FIG. 8, in accordance with one or more embodiments of the present disclosure.
Figure 10B:
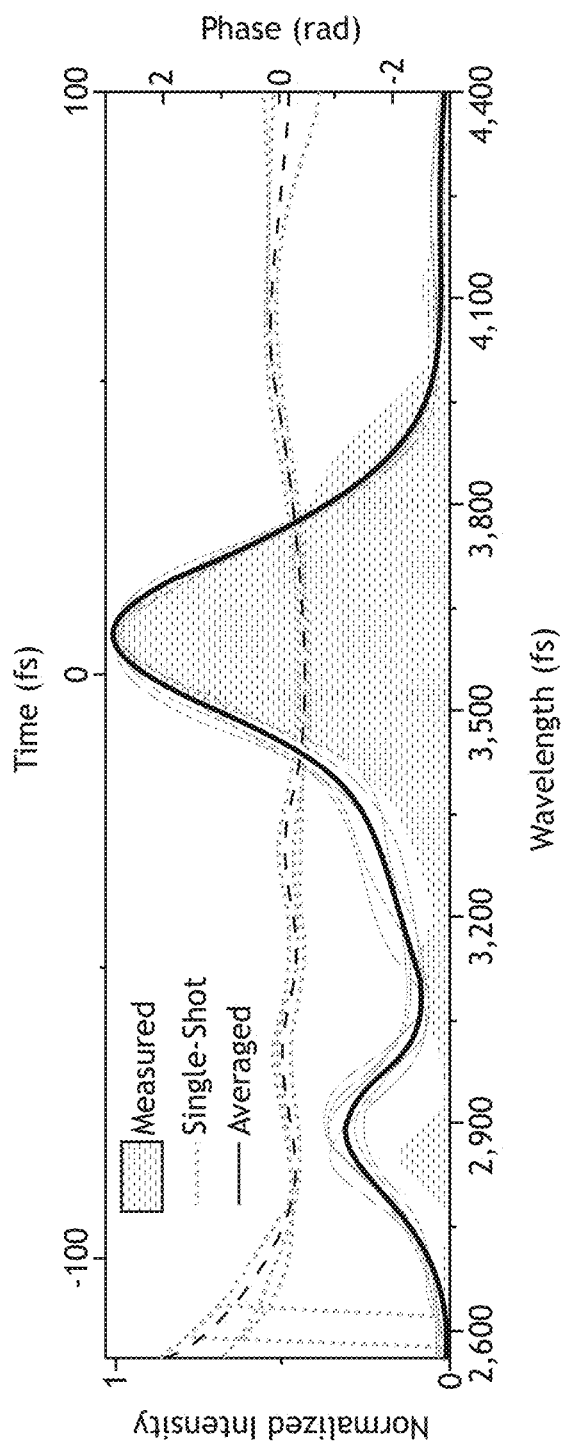
FIG. 10B is a plot of the spectra and spectral phases derived from the waveform from FIG. 10A, in accordance with one or more embodiments of the present disclosure.
Figure 10C:
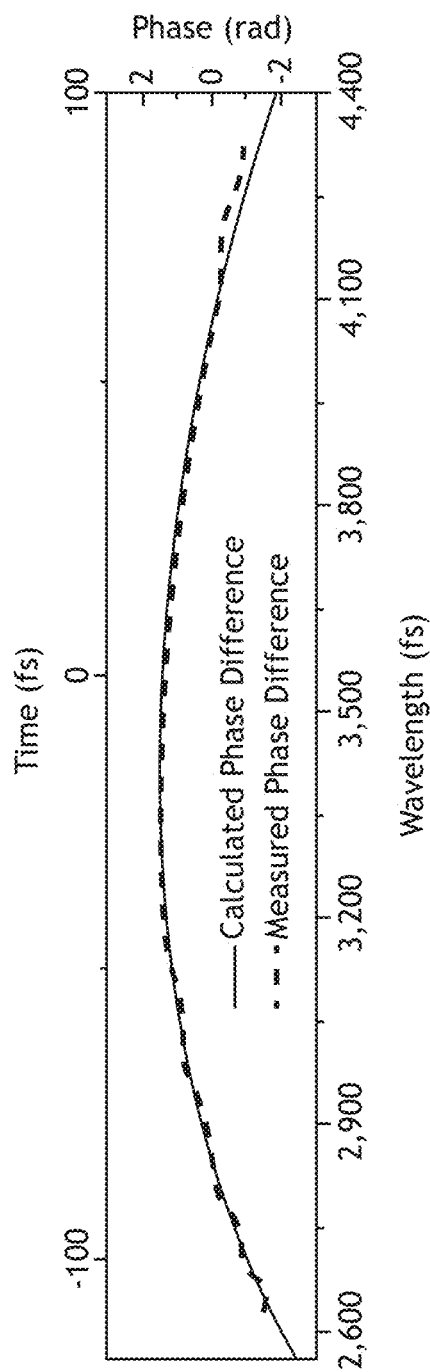
FIG. 10C is a plot of a measured spectral change as a result of adding a 2-mm-thick CaF2 window in the path of the perturbing pulse, in accordance with one or more embodiments of the present disclosure.
Figure 11:
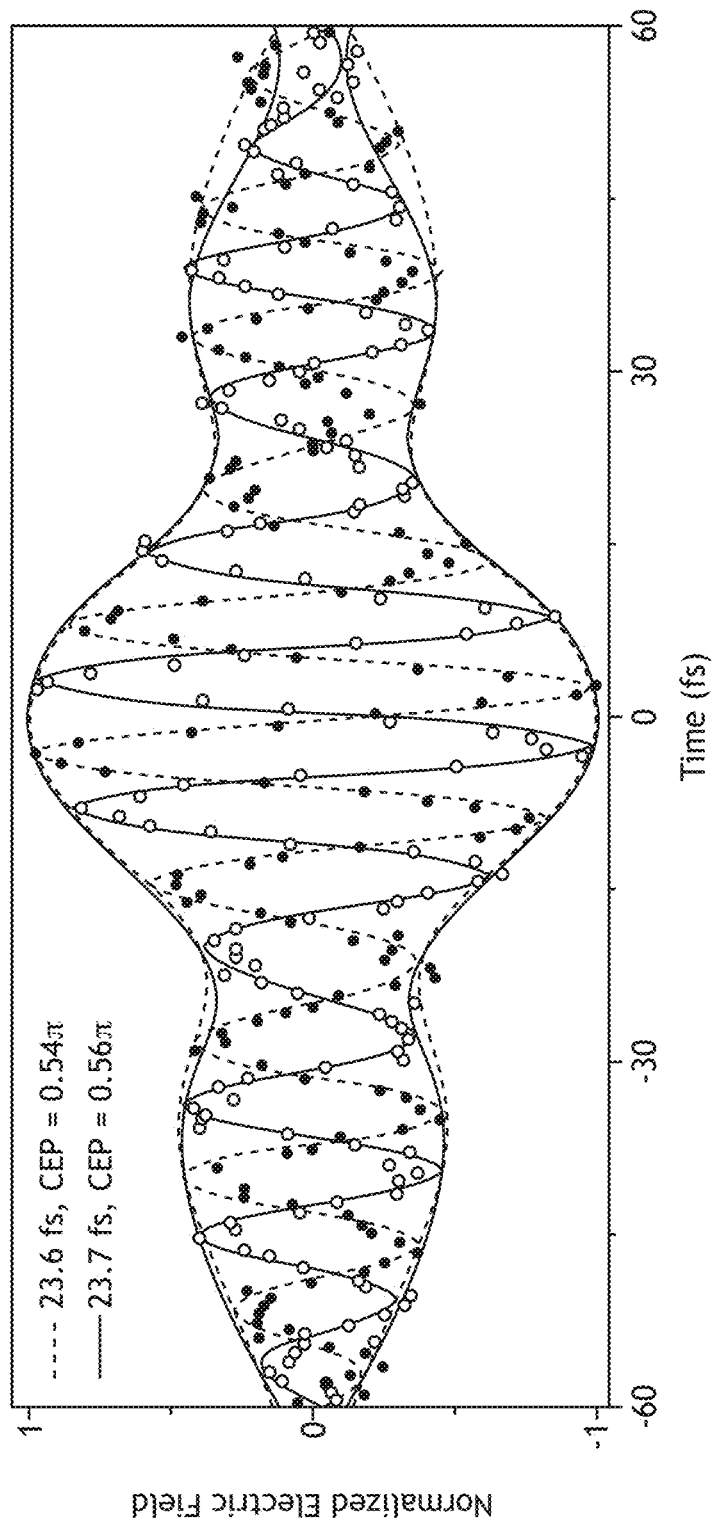
FIG. 11 is a plot illustrating the characterization of the CEP of the input pulse by the laser diagnostic device illustrated in FIG. 8, in accordance with one or more embodiments of the present disclosure.

FIG. 10A-11 further illustrate the measurement of few-cycle femtosecond pulses and CEP measurements.

FIG. 10A is a plot of a modulation waveform associated with a 2.1-cycle mid-IR pulse generated using non-linear compression as measured by the laser diagnostic device 100 illustrated in FIG. 8, in accordance with one or more embodiments of the present disclosure. In particular, FIG. 10A includes both single-shot and averaged data, again showing an excellent signal to noise ratio for a single-shot measurement.

FIG. 10B is a plot of the spectra and spectral phases derived from the waveform from FIG. 10A, in accordance with one or more embodiments of the present disclosure. As described with respect to FIGS. 9A-9C, the data from the laser diagnostic device 100 shows excellent agreement with independent measurements using a Fourier-transform spectrometer with a HgCdTe photodiode detector.

FIG. 10C is a plot of a measured spectral change as a result of adding a 2-mm-thick CaF2 window in the path of the perturbing pulse 108, in accordance with one or more embodiments of the present disclosure. FIG. 10C thus illustrates excellent agreement between the measured phase difference and a calculated phase difference, again highlighting the accuracy of the laser diagnostic device 100.

FIG. 11 is a plot illustrating the characterization of the CEP of the input pulse 104 by the laser diagnostic device 100 illustrated in FIG. 8, in accordance with one or more embodiments of the present disclosure. For the demonstration illustrated in FIG. 11, the fundamental pulse 106 and the perturbing pulse 108 were 2.1-cycle mid-IR pulses. Further, the CEP of the fundamental pulse 106 was set to zero using the SHG pulse 802 as described with respect to FIG. 8.

In particular, FIG. 11 illustrates measurements of the perturbing pulse 108 at $+/-\pi/2$ rad as controlled by a $CaF_2$ wedge inserted in the optical path of the perturbing pulse 108. In this was, FIG. 11 illustrates the ability to provide single-shot waveform and CEP characterization of an input pulse.

Referring now generally to FIGS. 1-11, it is to be understood that FIGS. 1-11 and the associated descriptions are provided solely for illustrative purposes and should not be interpreted as limiting. For example, it is contemplated herein that the laser diagnostic device 100 may be configured to provide scanning or single-shot electric field characterizations of pulses of any wavelength using an appropriate selection of the detector 112 and associated optics within the system.

Figure 12:
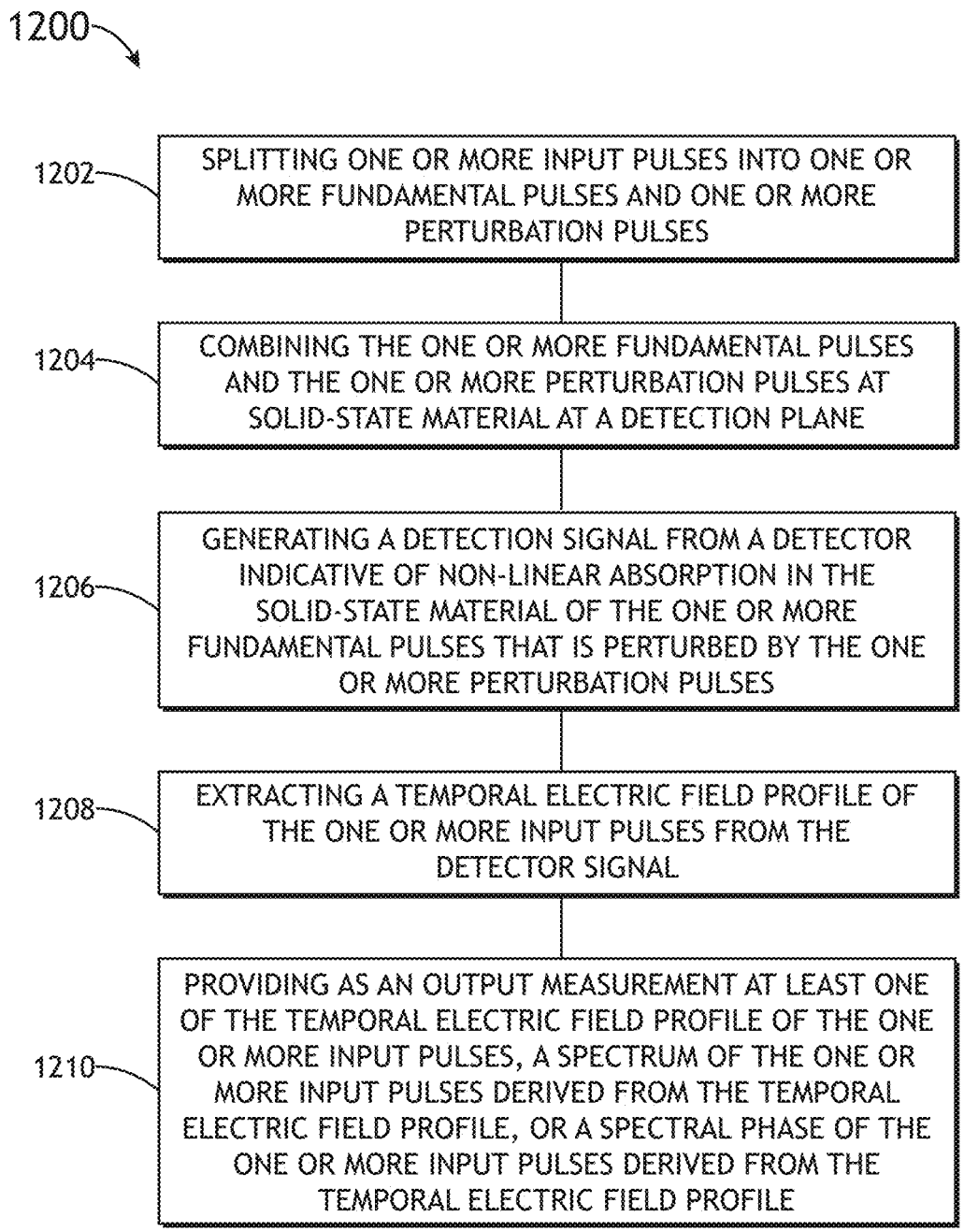
FIG. 12 is a flow diagram illustrating steps performed in a laser diagnostic method, in accordance with one or more embodiments of the present disclosure.

FIG. 12 is a flow diagram illustrating steps performed in a laser diagnostic method 1200, in accordance with one or more embodiments of the present disclosure. Applicant notes that the embodiments and enabling technologies described previously herein in the context of the laser diagnostic device 100 should be interpreted to extend to the method 1200. It is further noted, however, that the method 1200 is not limited to the architecture of the laser diagnostic device 100.

In some embodiments, the method 1200 includes a step 1202 of splitting one or more input pulses into one or more fundamental pulses and one or more perturbation pulses, where the one or more fundamental pulses have a higher power than the perturbation pulses. For example, the step 1202 may include splitting the input pulses using a beamsplitter.

In some embodiments, the method 1200 includes a step 1204 of combining the one or more fundamental pulses and the one or more perturbation pulses at solid-state material at a detection plane. In some embodiments, the method 1200 includes a step 1206 of generating a detection signal from a detector indicative of non-linear absorption in the solid-state material of the one or more fundamental pulses that is perturbed by the one or more perturbation pulses. For example, the non-linear absorption in the solid-state material may be associated with tunneling and/or multi-photon excitation processes.

It is contemplated herein that the steps 1204 and 1206 may provide either single-pulse measurements or multi-pulse measurements. For example, single-pulse measurements may be performed by combining (e.g., step 1204) a single fundamental pulse and a single perturbation pulse in a crossed geometry on the solid-state material. In this way, different spatial coordinates of the multi-pixel sensor may correspond to different time-delays between the fundamental and perturbation pulses. By way of another example, multi-pulse measurements may be provided by combining (e.g., step 1206) fundamental pulses and perturbation pulses at varying delay times (e.g., using a delay stage, or the like).

It is further contemplated herein that different detection geometries associated with 1206 are within the spirit and scope of the present disclosure. In some embodiments, the solid-state material includes a sensor such as, but not limited to, one or more photodiodes or an image sensor. In this way, the sensor may directly generate a detection signal based on an induced photocurrent associated with the non-linear absorption. In some embodiments, the solid-state material includes a non-linear material (e.g., a non-linear crystal, or the like) that generates light emission based on the non-linear absorption. In this way, the detector may include an additional sensor to capture the light emission.

In some embodiments, the method 1200 includes a step 1208 of extracting a temporal electric field profile of the one or more input pulses from the detector signal. For example, the detector signal may include a signal associated with the nonlinear absorption of the fundamental pulse that is perturbed by the perturbation pulse. Accordingly, the step 1208 may include isolating the signal associated with the perturbation pulse. In some embodiments, the method 1200 includes a step 1210 of providing as an output measurement at least one of the temporal electric field profile of the one or more input pulses, a spectrum of the one or more input pulses derived from the temporal electric field profile, or a spectral phase of the one or more input pulses derived from the temporal electric field profile.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A laser diagnostic device comprising:
a beamsplitter configured to receive one or more input pulses and split the one or more input pulses into one or more fundamental pulses and one or more perturbation pulses, the one or more fundamental pulses having a higher power than the one or more perturbation pulses;
one or more beam-combining optics to combine the one or more fundamental pulses and the one or more perturbation pulses at a detection plane;
a detector including a solid-state material located at the detection plane; and
a controller including one or more processors configured to execute program instructions causing the one or more processors to:
receive a detector signal from the detector, wherein the detector signal is indicative of non-linear absorption in a solid-state medium of the one or more fundamental pulses that is perturbed by the one or more perturbation pulses;
extract a temporal electric field profile of the one or more input pulses from the detector signal; and
provide one or more output measurements, wherein the one or more output measurements include at least one of the temporal electric field profile of the one or more input pulses, a spectrum of the one or more input pulses derived from the temporal electric field profile, or a spectral phase of the one or more input pulses derived from the temporal electric field profile.

2. The laser diagnostic device of claim 1, wherein the non-linear absorption comprises:
at least one of a tunneling excitation or a multi-photon excitation process.

3. The laser diagnostic device of claim 1, wherein the one or more input pulses comprise a single input pulse, wherein the beamsplitter splits the single input pulse into a single fundamental pulse and a single perturbation pulse, wherein the one or more beam-combining optics combine the single fundamental pulse and the single perturbation pulse associated with the single input pulse at the detection plane in a noncollinear geometry, wherein the one or more beam-combining optics include one or more cylindrical focusing optics to focus the single fundamental pulse and the single perturbation pulse to line beams that intersect at the detection plane, wherein a spatial dimension of the detector signal maps to a temporal dimension of the temporal electric field profile of the single input pulse.

4. The laser diagnostic device of claim 3, wherein the solid-state material at the detection plane includes a multi-pixel sensor, wherein the multi-pixel sensor generates the detector signal.

5. The laser diagnostic device of claim 4, wherein the multi-pixel sensor comprises:
at least one of a charge-coupled device (CCD) or a complementary metal-oxide-semiconductor (CMOS) device.

6. The laser diagnostic device of claim 4, wherein the multi-pixel sensor comprises:
one or more photodetectors.

7. The laser diagnostic device of claim 6, wherein the one or more photodetectors comprises:
at least one of a Si photodiode, a GaP photodiode, or an AlGaN photodiode.

8. The laser diagnostic device of claim 3, wherein the solid-state material comprises:
a non-linear material, wherein the detector further includes a sensor configured to detect light emission from the non-linear material indicative of nonlinear absorption of the one or more fundamental pulses that is perturbed by the one or more perturbation pulses, wherein the detector signal is associated with the light emission.

9. The laser diagnostic device of claim 8, wherein the non-linear material comprises:
a ZnO crystal.

10. The laser diagnostic device of claim 8, wherein the sensor comprises:
an imaging sensor configured to image the detection plane.

11. The laser diagnostic device of claim 8, wherein the light emission comprises:
band fluorescence.

12. The laser diagnostic device of claim 1, wherein the one or more input pulses comprise an input beam with a plurality of input pulses, wherein the beamsplitter splits the input beam into a fundamental beam with a plurality of fundamental pulses and a perturbation beam with a plurality of perturbation pulses, wherein the one or more beam-combining optics combine the fundamental beam and the perturbation beam along a collinear path including the detection plane, wherein the one or more beam-combining optics further comprise:
an adjustable delay line configured to delay the perturbation beam with respect to the fundamental beam, wherein the detector signal is a temporal scanning detector signal associated with a plurality of delay values of the adjustable delay line to provide a plurality of relative temporal shifts between pulses of the fundamental beam and the perturbation beam.

13. The laser diagnostic device of claim 12, wherein the solid-state material comprises:
a non-linear material, wherein the detector further includes a sensor configured to detect light emission from the non-linear material indicative of nonlinear absorption of the fundamental beam that is perturbed by the perturbation beam, wherein the detector signal is associated with the light emission.

14. The laser diagnostic device of claim 13, wherein the non-linear material comprises:
a ZnO crystal.

15. The laser diagnostic device of claim 13, wherein the sensor comprises:
a spectrometer.

16. The laser diagnostic device of claim 13, wherein the sensor comprises:
a spectral filter; and
a photodiode.

17. The laser diagnostic device of claim 13, wherein the light emission comprises:
band fluorescence.

18. The laser diagnostic device of claim 12, wherein the solid-state material comprises:
a photodetector, wherein the photodetector generates the detector signal.

19. The laser diagnostic device of claim 18, wherein the photodetector comprises:
at least one of a Si photodiode, a GaP photodiode, or an AlGaN photodiode.

20. The laser diagnostic device of claim 1, wherein a bandgap energy of the solid-state material in the detector provides an upper operational limit for a photon energy of the one or more input pulses.

21. The laser diagnostic device of claim 1, wherein the detector provides an operational wavelength range for the one or more input pulses including visible wavelengths.

22. The laser diagnostic device of claim 1, wherein the detector provides an operational wavelength range for the one or more input pulses including near-infrared wavelengths.

23. The laser diagnostic device of claim 1, wherein the detector provides an operational wavelength range for the one or more input pulses including mid-infrared wavelengths.

24. A laser diagnostic method comprising:
splitting one or more input pulses into one or more fundamental pulses and one or more perturbation pulses, the one or more fundamental pulses having a higher power than the one or more perturbation pulses;
combining the one or more fundamental pulses and the one or more perturbation pulses at solid-state material at a detection plane;
generating a detector signal from a detector indicative of non-linear absorption in a solid-state medium of the one or more fundamental pulses that is perturbed by the one or more perturbation pulses;
extracting a temporal electric field profile of the one or more input pulses from the detector signal; and
providing one or more output measurements, wherein the one or more output measurements include at least one of the temporal electric field profile of the one or more input pulses, a spectrum of the one or more input pulses derived from the temporal electric field profile, or a spectral phase of the one or more input pulses derived from the temporal electric field profile.

* * * * *